United States Patent
Pandev et al.

(10) Patent No.: US 11,604,063 B2
(45) Date of Patent: Mar. 14, 2023

(54) SELF-CALIBRATED OVERLAY METROLOGY USING A SKEW TRAINING SAMPLE

(71) Applicant: KLA Corporation, Milpitas, CA (US)

(72) Inventors: Stilian Pandev, Santa Clara, CA (US); Min-Yeong Moon, Ann Arbor, MI (US); Andrei V. Shchegrov, Campbell, CA (US); Jonathan Madsen, Los Altos, CA (US); Dimitry Sanko, Vallejo, CA (US); Liran Yerushalmi, Zicron Yaacob (IL); Alexander Kuznetsov, Austin, TX (US); Mahendra Dubey, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 12 days.

(21) Appl. No.: 17/473,742

(22) Filed: Sep. 13, 2021

(65) Prior Publication Data
US 2022/0412734 A1    Dec. 29, 2022

Related U.S. Application Data

(60) Provisional application No. 63/214,558, filed on Jun. 24, 2021.

(51) Int. Cl.
*G01B 21/24* (2006.01)

(52) U.S. Cl.
CPC .................................. *G01B 21/24* (2013.01)

(58) Field of Classification Search
CPC ....... G06T 7/12; G01B 21/24; G03F 7/70633; G03F 7/70516; G03F 7/70775
See application file for complete search history.

(56) References Cited

U.S. PATENT DOCUMENTS

| 5,608,526 A | 3/1997 | Piwonka-Corle et al. |
| 7,478,019 B2 | 1/2009 | Zangooie et al. |

(Continued)

FOREIGN PATENT DOCUMENTS

WO    03104929 A2    12/2003

OTHER PUBLICATIONS

Search Report and Written Opinion in International Application No. PCT/US2022/032927 dated Sep. 23, 2022, 8 pages.

(Continued)

*Primary Examiner* — Elias Desta
(74) *Attorney, Agent, or Firm* — Suiter Swantz pc llo

(57) ABSTRACT

An overlay metrology system may receive overlay data for in-die overlay targets within various fields on a skew training sample from one or more overlay metrology tools, wherein the in-die overlay targets within the fields have a range programmed overlay offsets, wherein the fields are fabricated with a range of programmed skew offsets. The system may further generate asymmetric target signals for the in-die overlay targets using an asymmetric function providing a value of zero when physical overlay is zero and a sign indicative of a direction of physical overlay. The system may further generate corrected overlay offsets for the in-die overlay targets on the asymmetric target signals, generate self-calibrated overlay offsets for the in-die overlay targets based on the programmed overlay offsets and the corrected overlay offsets, generate a trained overlay recipe, and generate overlay measurements for in-die overlay targets on additional samples using the trained overlay recipe.

26 Claims, 18 Drawing Sheets

(56) References Cited

U.S. PATENT DOCUMENTS

| | | |
|---|---|---|
| 7,929,667 B1 | 4/2011 | Zhuang et al. |
| 7,933,026 B2 | 4/2011 | Opsal et al. |
| 9,223,227 B2 * | 12/2015 | Bhattacharyya .... G03F 7/70633 |
| 9,291,554 B2 | 3/2016 | Kuznetsov et al. |
| 9,885,962 B2 | 2/2018 | Veldman et al. |
| 9,915,522 B1 | 3/2018 | Jiang et al. |
| 10,013,518 B2 | 7/2018 | Bakeman et al. |
| 10,101,670 B2 | 10/2018 | Pandev et al. |
| 10,324,050 B2 | 6/2019 | Hench et al. |
| 10,352,695 B2 | 7/2019 | Dziura et al. |
| 10,502,694 B2 | 12/2019 | Dziura et al. |
| 10,707,175 B2 * | 7/2020 | Zhao .................... H01L 23/544 |
| 10,769,320 B2 | 9/2020 | Kuznetsov et al. |
| 10,775,323 B2 | 9/2020 | Gellineau et al. |
| 2013/0245985 A1 | 9/2013 | Flock et al. |
| 2016/0290796 A1 | 10/2016 | Levy et al. |
| 2019/0017946 A1 | 1/2019 | Wack et al. |
| 2019/0086200 A1 | 3/2019 | Amit |
| 2019/0361358 A1 | 11/2019 | Tel et al. |
| 2021/0080839 A1 | 3/2021 | Drachuck et al. |
| 2021/0207956 A1 * | 7/2021 | Shchegrov ............. G01B 15/00 |
| 2022/0357673 A1 * | 11/2022 | Pandev ............... G03F 7/70633 |

OTHER PUBLICATIONS

Kline, R. Joseph et al., "X-ray scattering critical dimensional metrology using a compact x-ray source for next generation semiconductor devices" J. Micro/Nanolith. MEMS MOEMS 16(1), 014001 (Jan.-Mar. 2017).

Lemaillet, Germer et al., "Intercomparison between optical and x-ray scatterometry measurements of FinFET structures" Proc. SPIE, vol. 8681, p. 86810Q (2013)).

* cited by examiner

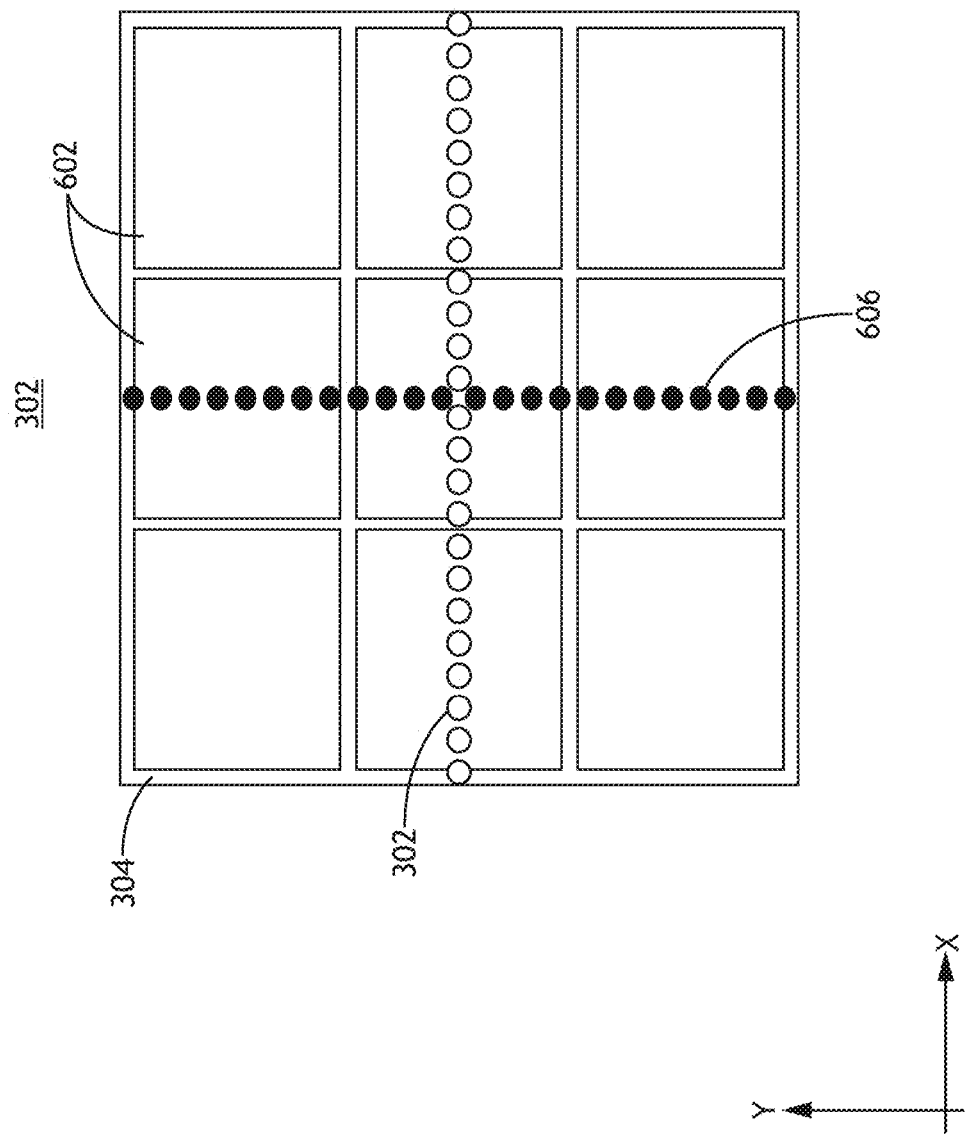

SELF-CALIBRATED OVERLAY METROLOGY USING A SKEW TRAINING SAMPLE

CROSS-REFERENCE TO RELATED APPLICATION

The present application claims the benefit under 35 U.S.C. § 119(e) of U.S. Provisional Application Ser. No. 63/214,558, filed Jun. 24, 2021, entitled SELF-CALIBRATED OVERLAY METROLOGY USING A SKEW TRAINING SAMPLE, naming Stilian Pandev, Min-Yeong Moon, Andre V. Shchegrov, Jonathan Madsen, Dim itry Sanko, Liran Yerushalmi, Alexander Kuznetsov, and Mahendra Dubey as inventors, which is incorporated herein by reference in the entirety.

TECHNICAL FIELD

The present disclosure relates generally to overlay metrology and, more particularly, to self-calibrated metrology using a skew training sample.

BACKGROUND

Overlay metrology systems typically characterize the overlay alignment of multiple layers of a sample by measuring the relative positions of overlay target features located on layers of interest. As the size of fabricated features decreases and the feature density increases, the demands on overlay metrology systems needed to characterize these features increase. Various techniques have been developed to measure overlay on a sample, such techniques typically suffer from burdensome complexity, inflexibility, or systematic errors that limit the applicability for demanding applications. There is therefore a need to develop systems and methods to cure the above deficiencies.

SUMMARY

An overlay metrology system is disclosed in accordance with one or more illustrative embodiments of the present disclosure. In one illustrative embodiment, the system receives overlay data for in-die overlay targets on a skew training sample from one or more overlay metrology tools, wherein the in-die overlay targets are distributed across fields associated with different exposures of a lithography tool. In another illustrative embodiment, the in-die overlay targets within at least some of the fields have programmed overlay offsets spanning a selected range around a value of zero. In another illustrative embodiment, the fields are fabricated with a range of programmed skew offsets associated with programmed errors of the lithography tool. In another illustrative embodiment, the system generates asymmetric target signals representative of physical overlay for the in-die overlay targets using an asymmetric function based on the overlay data, where the asymmetric function provides a value of zero when physical overlay is zero and a sign indicative of a direction of the physical overlay. In another illustrative embodiment, the system generates corrected overlay offsets for the in-die overlay targets on the skew training sample based on the asymmetric target signals. In another illustrative embodiment, the system generates self-calibrated overlay offsets for the in-die overlay targets on the skew training sample based on the programmed overlay offsets and the corrected overlay offsets. In another illustrative embodiment, the system generates a trained overlay recipe to provide overlay measurements based on overlay data from the one or more overlay metrology tools as inputs using training data including at least the corrected programmed overlay offsets and the overlay data of the in-die overlay targets on the skew training sample. In another illustrative embodiment, the system generates overlay measurements for one or more additional in-die overlay targets on one or more additional samples using the trained overlay recipe based on overlay data for the one or more additional in-die overlay targets from the one or more overlay metrology tools.

An overlay metrology system is disclosed in accordance with one or more illustrative embodiments of the present disclosure. In one illustrative embodiment, the system includes one or more overlay metrology tools. In another illustrative embodiment, the system includes a controller. In one illustrative embodiment, the controller receives overlay data for in-die overlay targets on a skew training sample from one or more overlay metrology tools, wherein the in-die overlay targets are distributed across fields associated with different exposures of a lithography tool. In another illustrative embodiment, the in-die overlay targets within at least some of the fields have programmed overlay offsets spanning a selected range around a value of zero. In another illustrative embodiment, the fields are fabricated with a range of programmed skew offsets associated with programmed errors of the lithography tool. In another illustrative embodiment, the controller generates asymmetric target signals representative of physical overlay for the in-die overlay targets using an asymmetric function based on the overlay data, where the asymmetric function provides a value of zero when physical overlay is zero and a sign indicative of a direction of the physical overlay. In another illustrative embodiment, the controller generates corrected overlay offsets for the in-die overlay targets on the skew training sample based on the asymmetric target signals. In another illustrative embodiment, the controller generates self-calibrated overlay offsets for the in-die overlay targets on the skew training sample based on the programmed overlay offsets and the corrected overlay offsets. In another illustrative embodiment, the controller generates a trained overlay recipe to provide overlay measurements based on overlay data from the one or more overlay metrology tools as inputs using training data including at least the corrected programmed overlay offsets and the overlay data of the in-die overlay targets on the skew training sample. In another illustrative embodiment, the controller generates overlay measurements for one or more additional in-die overlay targets on one or more additional samples using the trained overlay recipe based on overlay data for the one or more additional in-die overlay targets from the one or more overlay metrology tools.

An overlay metrology method is disclosed in accordance with one or more illustrative embodiments of the present disclosure. In one illustrative embodiment, the method includes preparing a skew training sample including in-die overlay targets distributed across fields associated with different exposures of a lithography tool. In another illustrative embodiment, the in-die overlay targets within at least some of the fields have programmed overlay offsets spanning a selected range around a value of zero. In another illustrative embodiment, the fields are fabricated with a range of programmed skew offsets associated with programmed errors of the lithography tool. In another illustrative embodiment, the method includes collecting overlay data for the in-die overlay targets on the skew training sample using the one or more overlay metrology tools. In another illustrative embodiment, the method includes generating asymmetric target signals representative of physical overlay for the in-die overlay targets using an asymmetric function based on the overlay data for the in-die overlay targets, where the asymmetric function provides a value of zero when physical overlay is zero and a sign indicative of a direction of the physical overlay. In another illustrative embodiment, the method includes generating corrected overlay offsets for the in-die overlay targets on the skew training sample based on the asymmetric target signals. In another illustrative embodiment, the method includes generating self-calibrated overlay offsets for the in-die overlay targets on the skew training sample based on the programmed overlay offsets and the corrected overlay offsets. In another illustrative embodiment, the method includes generating a trained overlay recipe to provide overlay measurements based on overlay data from the one or more overlay metrology tools as inputs using training data including at least the corrected programmed overlay offsets and the overlay data of the in-die overlay targets on the skew training sample. In another illustrative embodiment, the method includes generating overlay measurements for one or more in-die overlay targets on one or more additional samples using the trained overlay recipe based on overlay data for the one or more additional in-die overlay targets from the one or more overlay metrology tools.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 6 is a schematic view of a single field illustrating a sampling plan for the collection of overlay data on various in-die overlay targets having various programmed overlay offsets, in accordance with one or more embodiments of the present disclosure.

DETAILED DESCRIPTION

Figure 1A:
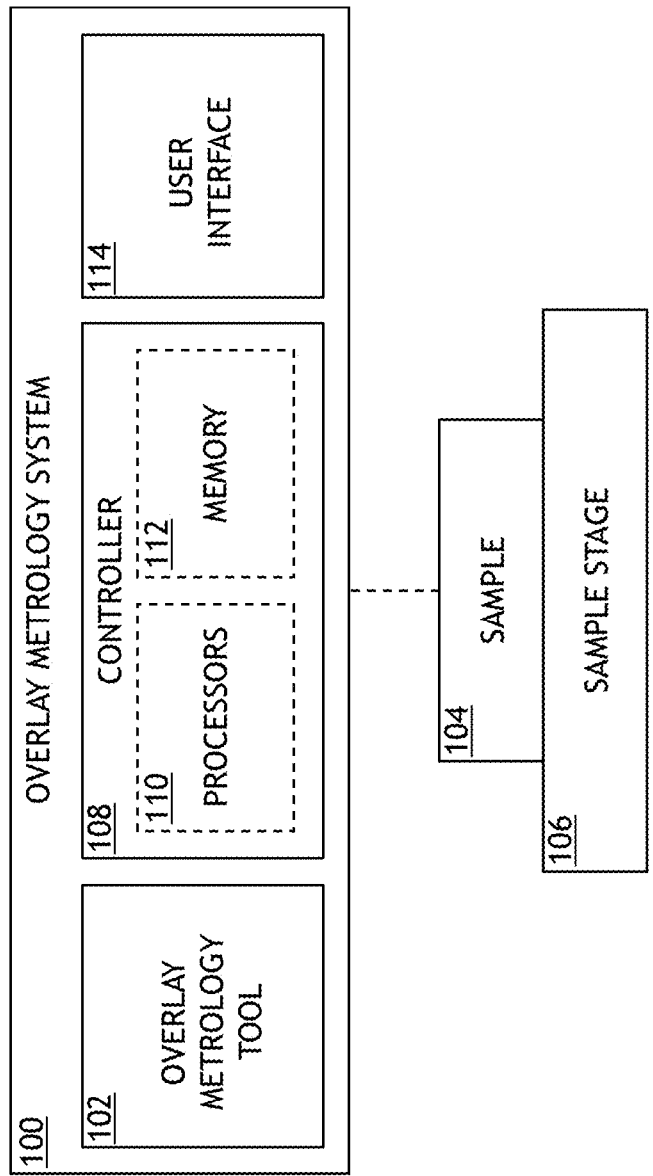
FIG. 1A is a conceptual view of an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for providing self-calibrated overlay metrology measurements by training an overlay recipe with a skew training wafer. The skew training wafer may include in-die overlay targets distributed across various fields associated with different exposures from a lithography tool. Each (or at least some) of the fields may include a series of in-die overlay targets having a range of programmed overlay offsets (e.g., intentional offsets). Further, the various fields may be fabricated with a range of programmed skew offsets (e.g., intentional magnification and/or rotation variations).

For the purposes of the present disclosure, the term overlay is used to describe relative positions of features on a sample fabricated by two or more lithographic patterning steps, where the term overlay error describes a deviation of the features from a nominal arrangement. For example, a multi-layered device may include features patterned on multiple sample layers using different lithography steps for each layer, where the alignment of features between layers must typically be tightly controlled to ensure proper performance of the resulting device. Accordingly, an overlay measurement may characterize the relative positions of features on two or more of the sample layers. By way of another example, multiple lithography steps may be used to fabricate features on a single sample layer. Such techniques, commonly called double-patterning or multiple-patterning techniques, may facilitate the fabrication of highly dense features near the resolution of the lithography system. An overlay measurement in this context may characterize the relative positions of the features from the different lithography steps on this single layer. It is to be understood that examples and illustrations throughout the present disclosure relating to a particular application of overlay metrology are provided for illustrative purposes only and should not be interpreted as limiting the disclosure.

Overlay measurements may generally be performed directly on features of a fabricated device (e.g., device features) or on dedicated overlay targets printed using the same lithography steps as the device features. Overlay on device features or in-die device features may beneficially provide measurements on or near the locations of interest on the sample, but may require the use of an overlay recipe involving complex models to relate metrology data to a measurement of physical overlay. Further, the overlay recipe may need to be retrained or adjusted over time to compensate for drifts or deviations of processing equipment or sample variations. In contrast, dedicated overlay targets may generally be placed at any suitable location (e.g., in-die or in scribe lines) and may further include features with characteristics (e.g., size, density, orientation, or the like) specially designed to facilitate overlay measurements. However, a critical challenge to the use of dedicated overlay targets is ensuring that the overlay measurement generated by the dedicated overlay target accurately represents the actual overlay of the device features. A target-based overlay measurement may deviate from an actual overlay of device features for various reasons. For instance, differences in size, orientation, density, or physical location between the target features and the device features may result in fabrication deviations that manifest as systematic errors in the overlay measurement. Additionally, different overlay techniques and target designs may have different tradeoffs between size, accuracy, illumination source requirements and measurement complexity or speed.

Embodiments of the present disclosure are directed to self-calibrated overlay measurements of in-die overlay targets, where an in-die overlay target may include a dedicated in-die target and/or portions of device features suitable for overlay measurements. It is contemplated that the systems and methods disclosed herein may overcome various challenges associated with existing in-die overlay metrology techniques such as, but not limited to, inaccuracies of the overlay recipe in the presence of process variations such as, but not limited to, skew parameters of exposure fields (e.g., magnification, rotation, or the like) or the position of exposure fields. In particular, the evaluation of asymmetric target signals as disclosed herein on a skew training wafer including programmed variations in skew parameters and programmed variations of overlay in in-die overlay targets may provide self-calibrated overlay data suitable for training an overlay recipe such that the overlay recipe may be robust to such process variations.

Further, training overlay data for training the overlay recipe may include asymmetric target signals for the various in-die overlay targets across the skew training sample that are corrected to compensate for inaccuracies of a lithography tool (e.g., a scanner, a stepper, or the like) used to fabricate both the skew training sample and additional samples of interest. In this way, the trained overlay recipe may provide accurate self-calibrated in-die overlay metrology measurements of additional samples with unknown overlay conditions.

In some embodiments, asymmetric target signals are generated for the in-die overlay targets across the skew training sample based on overlay data from one or more measurement configurations of one or more overlay metrology tools. The term asymmetric target signal is used herein to refer to a single-valued signal providing an asymmetric variation to physical overlay deviations from a nominal overlay condition. In this way, physical overlay deviations or errors along opposite directions may be distinguished. For example, an asymmetric target signal may have a value of zero when the physical overlay on an in-die overlay target is zero, where the sign of the asymmetric target signal in the presence of non-zero physical overlay is indicative of a direction of the physical overlay. Further, the asymmetric target signal may be, but is not required to be, a linear function of physical overlay within a selected operational range.

Asymmetric target signals may generally be generated based on overlay data generated using any overlay metrology technique suitable for in-die overlay measurements such as, but not limited to, Mueller ellipsometry, angular-resolved reflectometry (ARR), small-angle x-ray scatterometry (SAXS), soft x-ray reflectometry, or particle-beam metrology (e.g., electron-beam or SEM metrology). Further, asymmetric target signals may be generated based on a single measurement condition (e.g., a single measurement) or a mathematical combination of multiple overlay measurements associated with multiple measurement conditions and/or multiple overlay metrology tools.

For example, an asymmetric target signal may be a single-valued signal associated with a single measurement of an in-die metrology target with a single measurement configuration (e.g., incidence angle, collection angle, wavelength, polarization, or the like). By way of another example, an asymmetric target signal may be a single-valued signal associated with a combination of data associated with multiple measurement configurations such as, but not limited to, a sum or an average of data associated with multiple measurement configurations. As an illustration, an asymmetric target signal associated with overlay metrology data from an ellipsometer (e.g., a Mueller ellipsometer) may be generated by taking spectral data at opposing azimuth incidence angles, subtracting the spectral data for the opposing azimuth incidence angles, and summing the spectral data in the difference signal to generate a single-valued asymmetric target signal, where the value of this asymmetric target signal is zero when the physical overlay of the in-die overlay target is zero, and where the sign of the asymmetric target signal is indicative of a direction of an overlay error.

Additional embodiments of the present disclosure are directed to identifying measurement conditions or combinations of measurement conditions sensitive to overlay. In this way, the asymmetric target signals may be sensitive to overlay variations. For example, it may be the case that the sensitivity of any particular measurement conditions or combinations of measurement conditions may vary depending on the particular structure of an in-die target. In this way, asymmetric target signals may be developed for any desired in-die overlay target of interest. Further embodiments of the present disclosure are directed to identifying measurement conditions or combinations of measurement conditions that are insensitive to various other process variations such as, but not limited to, tilt.

Additional embodiments of the present disclosure are directed to generating corrected overlay offsets for the in-die overlay targets on the skew training sample based on the asymmetric target signals. For example, the asymmetric target signals within each field may be used to generate per-field correction functions to compensate for differences between the programmed overlay offsets and actual physical overlay offsets of the fabricated in-die overlay targets. As an illustration, an in-die overlay target having an asymmetric target signal of zero and thus an actual physical overlay offset of zero may be identified. The programmed overlay offset for this in-die overlay target (which may not be zero) may then be regarded as a field-zero programmed overlay offset and the per-field correction function may subtract this field-zero programmed overlay offset from the programmed overlay offsets to generate the corrected overlay offsets for the in-die overlay targets in the field.

Additional embodiments of the present disclosure are directed to generating self-corrected overlay data based on the programmed overlay offsets and the corrected overlay offsets.

Further, the offset corrections associated with the various fields of the skew training sample having different skew variations may be combined to generate a relationship between the programmed overlay offset and the corrected overlay suitable for correcting all overlay measurements across the skew training sample. For example, a composite correction function may be generated to describe a relationship between the programmed overlay offsets and the corrected overlay offsets across the skew training sample. In this way, the self-corrected overlay offsets on the skew training wafer may accurately reflect the physical overlay on the sample and may further be robust to skew offsets.

Additional embodiments of the present disclosure are directed to training an overlay recipe for in-die metrology using the self-calibrated overlay offsets for the in-die overlay targets across the skew training sample and the associated overlay data. Any type of overlay recipe suitable for generating overlay measurements from data generated by an in-die overlay metrology tool may be used including, but not limited to, electromagnetic modeling techniques that models the interaction of an incident beam from an in-die overlay metrology tool with an in-die overlay target, a supervised machine-learning technique, an unsupervised machine-learning technique, a model-less technique, or a combination thereof. In some embodiments, the self-calibrated overlay measurements from the skew training sample are used to train a supervised machine learning model. Further, various additional data may be used in combination with self-calibrated overlay measurements, which may improve the robustness and/or accuracy of the trained overlay recipe. For example, a training set may additionally include, but is not limited to, synthetically-generated data from a parameterized model of the in-die overlay targets, or unlabeled in-die overlay metrology data from various samples from one or more lots without any external references.

Additional embodiments of the present disclosure are directed to generating overlay measurements on additional samples with unknown overlay characteristics (e.g., run-time samples) using the trained overlay recipe. For example, overlay data similar to the type of overlay data used to train the overlay recipe may be generated for the run-time samples and provided as input data to the trained overlay recipe. The trained overlay recipe may then generate run-time overlay measurements on these run-time samples.

Additional embodiments of the present disclosure are directed to providing overlay data to one or more process tools. Overlay data from an overlay metrology tool may generally include any output of an overlay metrology tool having sufficient information to determine overlay (or overlay errors) associated with various lithography steps. For example, overlay data may include, but is not required to include, one or more datasets, one or more images, one or more detector readings, or the like. This overlay data may then be used for various purposes including, but not limited to, diagnostic information of the lithography tools or for the generation of process-control correctables. For instance, overlay data for samples in a lot may be used to generate feedback correctables for controlling the lithographic exposure of subsequent samples in the same lot. In another instance, overlay data for samples in a lot may be used to generate feed-forward correctables for controlling lithographic exposures for the same or similar samples in subsequent lithography steps to account for any deviations in the current exposure.

Referring now to FIGS. 1A-13, systems and methods for providing self-calibrated in-die overlay metrology using a skew training wafer are described in greater detail, in accordance with one or more embodiments of the present disclosure.

FIG. 1A is a conceptual view of an overlay metrology system 100, in accordance with one or more embodiments of the present disclosure.

In some embodiments, the overlay metrology system 100 includes an overlay metrology tool 102 configured to generate overlay data associated with various overlay targets distributed on a sample 104. (e.g., device targets, assist targets, or the like). In some embodiments, the sample 104 is disposed on a sample stage 106. The sample stage 106 may include any device suitable for positioning and/or scanning the sample 104 within the overlay metrology tool 102. For example, the sample stage 106 may include any combination of linear translation stages, rotational stages, tip/tilt stages, or the like. In this way, the sample stage 106 may align a selected overlay target within a measurement field of view of the overlay metrology tool 102 for a measurement.

The overlay metrology tool 102 may illuminate the sample 104 with at least one illumination beam and collect at least one measurement signal from the sample 104 in response to the illumination beam. The illumination beam may include, but is not limited to, an optical beam (e.g., a light beam) at any wavelength or range of wavelengths, an x-ray beam, an electron beam, or an ion beam. In this way, the overlay metrology tool 102 may operate as, but is not limited to, an optical metrology tool, an x-ray metrology tool, an electron-beam (e.g., e-beam) metrology tool, or an ion beam metrology tool.

In some embodiments, the overlay metrology system 100 includes a controller 108 communicatively coupled to the overlay metrology tool 102 and/or any components therein. In some embodiments, the controller 108 includes one or more processors 110. For example, the one or more processors 110 may be configured to execute a set of program instructions maintained in a memory device 112, or memory. The one or more processors 110 of a controller 108 may include any processing element known in the art. In this sense, the one or more processors 110 may include any microprocessor-type device configured to execute algorithms and/or instructions.

The controller 108 may direct (e.g., through control signals) or receive data from the overlay metrology tool 102 or any components therein. The controller 108 may further be configured to perform any of the various process steps described throughout the present disclosure such as, but not limited to, generating asymmetric target signals for in-die metrology targets on a skew training sample, determining overlay offset corrections for in-die overlay targets in the various fields of the skew training sample based on the asymmetric target signals, determining a relationship between programmed (e.g., intended) overlay offsets and corrected offset values for a lithography tool used to fabricate the skew training sample based on the overlay offset corrections and the programmed overlay offsets, generate self-calibrated overlay data for the skew training sample based on this relationship, train an overlay recipe with at least the self-calibrated overlay data, and/or utilize the trained overlay recipe to generate overlay measurements on additional samples (e.g., run-time samples) with unknown overlay values.

In some embodiments, the memory device 112 includes a data server. For example, the data server may collect and store data from the overlay metrology tool 102 or other external tools associated with a skew training sample and/or additional samples (e.g., run-time samples) with unknown overlay values. For example, the data server may store a map or layout of the skew training wafer including programmed skew variations and programmed overlay offsets for the in-die overlay targets, the asymmetric target signals for the in-die overlay targets, the overlay offset corrections, the self-calibrated overlay data, the overlay recipe, and/or overlay data for run-time samples. Further, the data server may store overlay measurements for such samples after any number of processing steps such as, but not limited to, after-development inspection (ADI) data, after-cleaning inspection (ACI) data, or after-etch inspection (AEI) data. The data server may also store any training data associated with training or otherwise generating an overlay recipe. The controller 108 may then utilize any such data to create, update, retrain, or modify the overlay recipe.

In some embodiments, the overlay metrology system 100 includes a user interface 114 communicatively coupled to the controller 108. In some embodiments, the user interface 114 may include, but is not limited to, one or more desktops, laptops, tablets, and the like. In some embodiments, the user interface 114 includes a display used to display data of the overlay metrology system 100 to a user. The display of the user interface 114 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 114 is suitable for implementation in the present disclosure. In some embodiments, a user may input selections and/or instructions responsive to data displayed to the user via a user input device of the user interface 114.

Figure 1B:
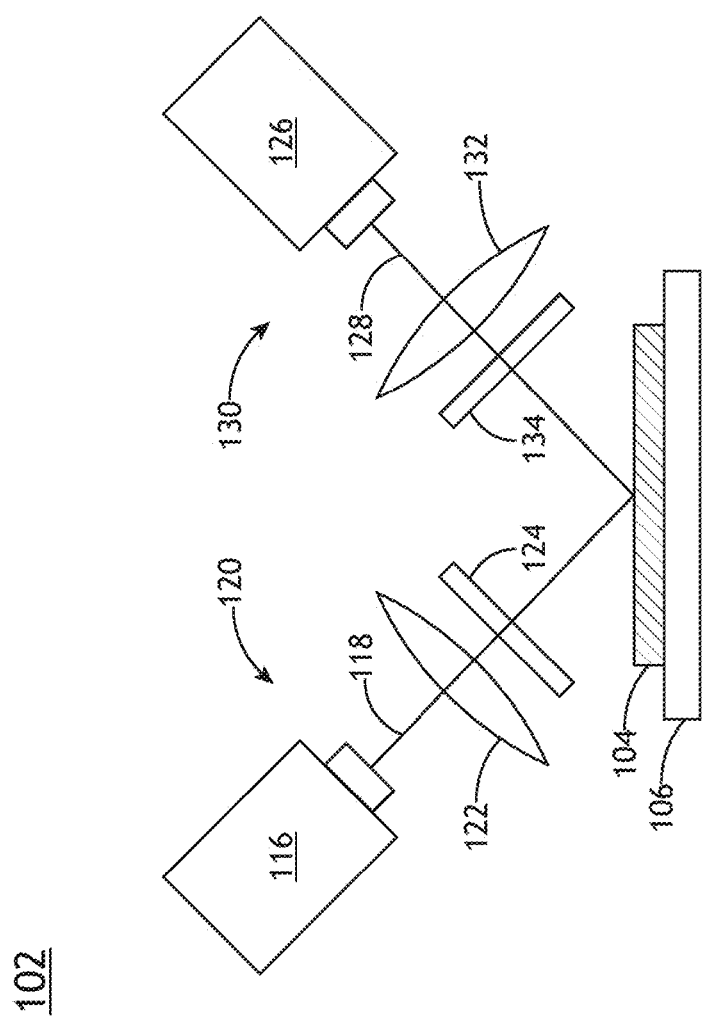
FIG. 1B is a conceptual view of an optical overlay metrology tool, in accordance with one or more embodiments of the present disclosure.

Referring now to FIG. 1B, a non-limiting illustration of the overlay metrology tool 102 is described, in accordance with one or more embodiments of the present disclosure. FIG. 1B is a conceptual view of an optical overlay metrology tool 102, in accordance with one or more embodiments of the present disclosure. For example, FIG. 1B may generally illustrate various configurations of an optical metrology tool including, but not limited to, a spectroscopic ellipsometer (SE), an SE with multiple angles of illumination, an SE measuring Mueller matrix elements (e.g. using rotating compensator(s)), a single-wavelength ellipsometer, a beam profile ellipsometer (angle-resolved ellipsometer), a beam profile reflectometer (angle-resolved reflectometer), a broadband reflective spectrometer (spectroscopic reflectometer), a single-wavelength reflectometer, an angle-resolved reflectometer, an imaging system, or a scatterometer (e.g., speckle analyzer). The wavelengths for optical systems can vary from about 120 nm to 3 microns. For non-ellipsometer systems, the signals collected can be polarization-resolved or unpolarized.

In some embodiments, the overlay metrology tool 102 includes an illumination source 116 to generate an optical illumination beam 118. The illumination beam 118 may include one or more selected wavelengths of light including, but not limited to, ultraviolet (UV) radiation, visible radiation, or infrared (IR) radiation.

The illumination source 116 may be any type of illumination source known in the art suitable for generating an optical illumination beam 118. In some embodiments, the illumination source 116 includes a broadband plasma (BBP) illumination source. In this regard, the illumination beam 118 may include radiation emitted by a plasma. For example, a BBP illumination source 116 may include, but is not required to include, one or more pump sources (e.g., one or more lasers) configured to focus into the volume of a gas, causing energy to be absorbed by the gas in order to generate or sustain a plasma suitable for emitting radiation. Further, at least a portion of the plasma radiation may be utilized as the illumination beam 118.

In some embodiments, the illumination source 116 may include one or more lasers. For instance, the illumination source 116 may include any laser system known in the art capable of emitting radiation in the infrared, visible, or ultraviolet portions of the electromagnetic spectrum.

The illumination source 116 may further produce an illumination beam 118 having any temporal profile. For example, the illumination source 116 may produce a continuous illumination beam 118, a pulsed illumination beam 118, or a modulated illumination beam 118. Additionally, the illumination beam 118 may be delivered from the illumination source 116 via free-space propagation or guided light (e.g., an optical fiber, a light pipe, or the like).

In some embodiments, the illumination source 116 directs the illumination beam 118 to the sample 104 via an illumination pathway 120. The illumination pathway 120 may include one or more illumination pathway lenses 122 or additional optical components 124 suitable for modifying and/or conditioning the illumination beam 118. For example, the one or more optical components 124 may include, but are not limited to, one or more polarizers, one or more filters, one or more beam splitters, one or more diffusers, one or more homogenizers, one or more apodizers, or one or more beam shapers.

In some embodiments, the overlay metrology tool 102 includes a detector 126 configured to capture photon or particle emissions from the sample 104 (e.g., a collection signal 128) through a collection pathway 130. The collection pathway 130 may include, but is not limited to, one or more collection pathway lenses 132 for directing at least a portion of the collection signal 128 to a detector 126. For example, a detector 126 may receive collected reflected or scattered light (e.g., via specular reflection, diffuse reflection, and the like) from the sample 104 via one or more collection pathway lenses 132. By way of another example, a detector 126 may receive one or more diffracted orders of radiation from the sample 104 (e.g., 0-order diffraction, ±1 order diffraction, ±2 order diffraction, and the like). By way of another example, a detector 126 may receive radiation generated by the sample 104 (e.g., luminescence associated with absorption of the illumination beam 118, or the like).

The detector 126 may include any type of detector known in the art suitable for measuring illumination received from the sample 104. For example, a detector 126 may include, but is not limited to, a charge-coupled device (CCD) detector, a time delay integration (TDI) detector, a photomultiplier tube (PMT), an avalanche photodiode (APD), or the like. In some embodiments, a detector 126 may include a spectroscopic detector suitable for identifying wavelengths of light emanating from the sample 104.

The collection pathway 130 may further include any number of collection pathway lenses 132 or collection optical elements 134 to direct and/or modify collected illumination from the sample 104 including, but not limited to, one or more filters, one or more polarizers, one or more apodizers, or one or more beam blocks.

Referring now to FIGS. 2-13, various steps for performing self-calibrated in-die overlay metrology are described in greater detail, in accordance with one or more embodiments of the present disclosure.

Figure 2:
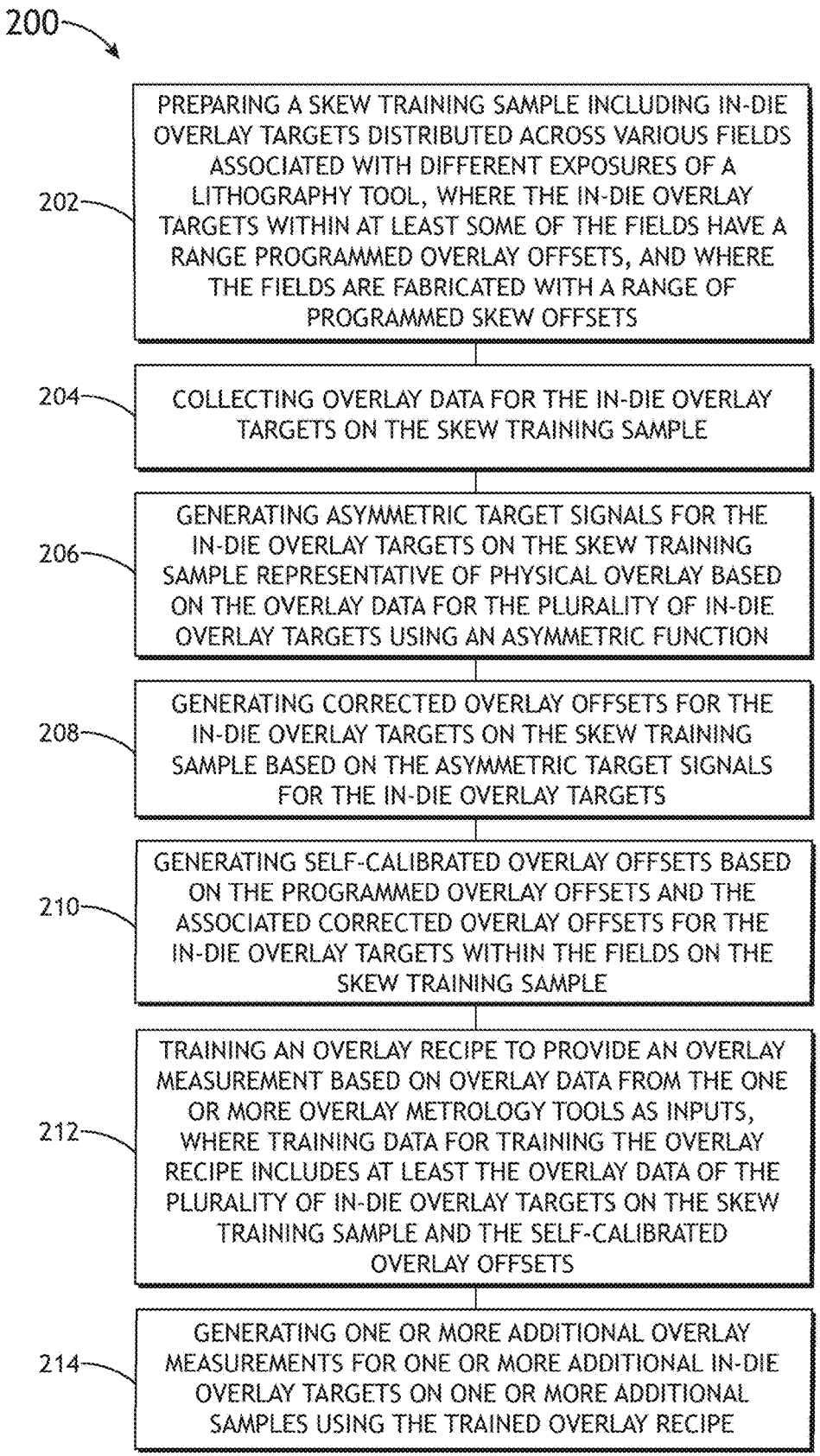
FIG. 2 is a flow diagram illustrating steps performed in a method for self-calibrated in-die overlay metrology, in accordance with one or more embodiments of the present disclosure.

FIG. 2 is a flow diagram illustrating steps performed in a method 200 for self-calibrated in-die overlay metrology, in accordance with one or more embodiments of the present disclosure. Applicant notes that the embodiments and enabling technologies described previously herein in the context of the overlay metrology system 100 should be interpreted to extend to the method 200. It is further noted, however, that the method 200 is not limited to the architecture of the overlay metrology system 100.

In some embodiments, the method 200 includes a step 202 of preparing a skew training sample including in-die overlay targets distributed across various fields associated with different exposures of a lithography tool, where the in-die overlay targets within at least some of the fields have programmed overlay offsets spanning a selected range around a value of zero, and where the fields are fabricated with a range of programmed skew offsets associated with programmed errors of the lithography tool.

Figure 3:
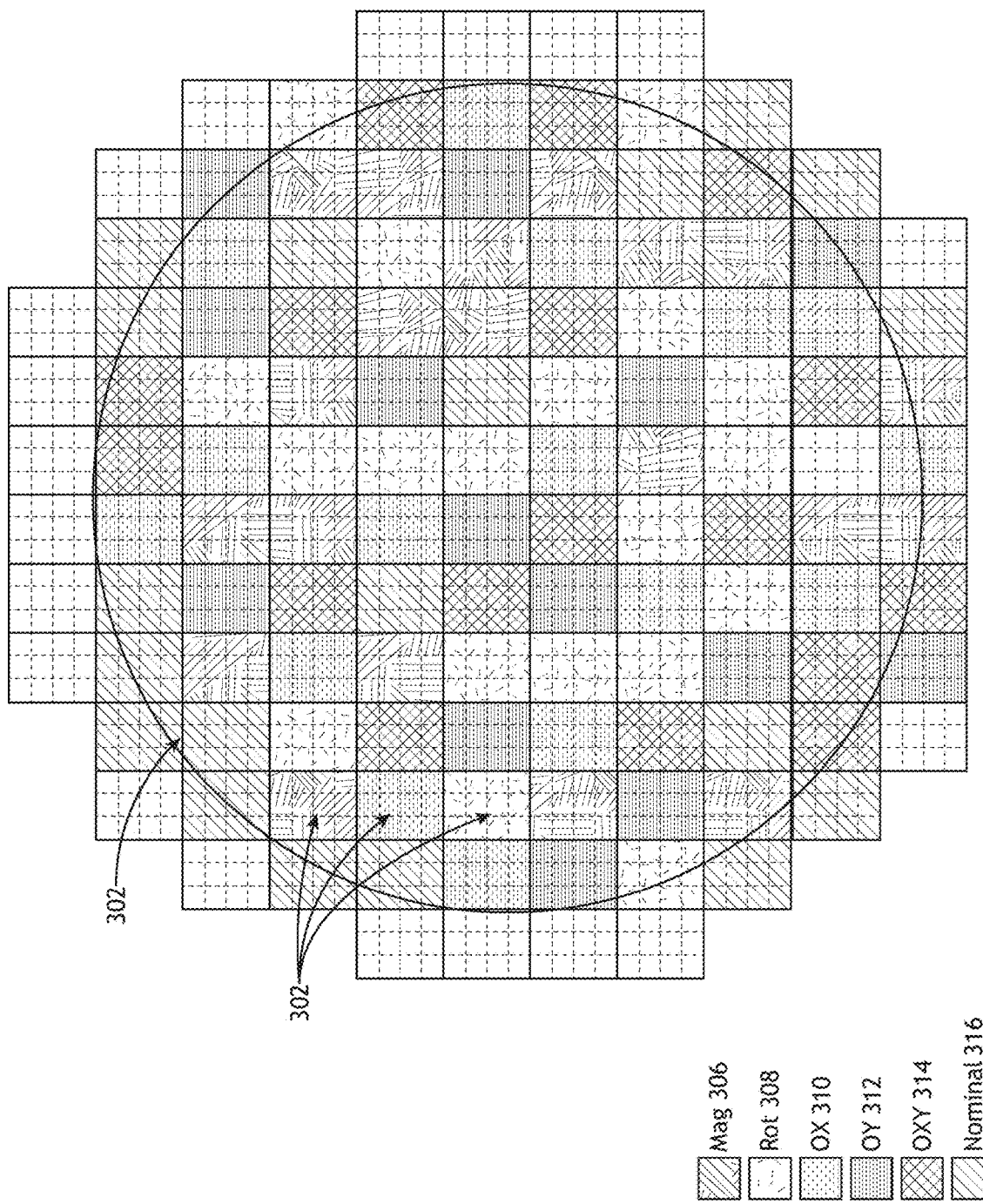
FIG. 3 is a top-view map of a skew training sample including various fields with varied programmed skew offsets, in accordance with one or more embodiments of the present disclosure.

As an illustration, FIG. 3 is a top-view map of a skew training sample 302 including various fields 304 with varied programmed skew offsets, in accordance with one or more embodiments of the present disclosure.

A programmed skew offset may generally include any type of programmed error in the exposure of a field 304 with a lithography tool (e.g., a scanner, a stepper, or the like). For example, a lithography tool may project an image of a reticle onto a portion of a sample (e.g., a field 304) to expose a photomask or other photosensitive layer with a pattern of features in one or more dies, which may be developed into a pattern of three-dimensional features through subsequent processing steps (e.g., etching, polishing, cleaning, or the like). The size of this field (e.g., a projected image size) is typically smaller than the sample such that many fields 304 are sequentially exposed on the sample. Accordingly, a programmed skew offset for a particular field 304 of a skew training sample 302 may include, but is not limited to, a programmed magnification error of the projected image, a programmed rotation error of the programmed image, a programmed overlay offset (e.g., a programmed positional error of the projected image) along one or more directions, or a combination thereof.

FIG. 3 illustrates a non-limiting configuration of a skew training sample 302 having six different categories of programmed skew offsets for the various fields 304: magnification offsets 306, rotation offsets 308, X-direction overlay offsets 310 (OX), Y-direction overlay offsets 312 (OY), combined X and Y direction overlay offsets 314 (OXY), and nominal conditions 316 (e.g., no programmed skew offsets). Further, the various programmed skew offsets may be distributed across the skew training sample 302 in any selected pattern including, but not limited to, a random pattern (e.g., as illustrated in FIG. 3) or a systematically varying pattern.

In addition to a programmed skew offset, each field 304 on a skew training sample 302 may include in-die overlay targets having varied programmed overlay offsets (e.g., intended overlay offsets $OVL_{INT}$) along one or more measurement directions of interest. For example, an in-die overlay target may include features on one or more sample layers associated with different lithographic exposures of the associated field 304 that are arranged with a nominal programmed overlay offset along any of the one or more measurement directions. In this way, the actual physical overlay offset associated with a particular in-die overlay target may be a combination of the programmed overlay offset $OVL_{INT}$, overlay offsets induced by the programmed skew offset for the associated field 304, and any unintended skew offsets associated with unintended process variations during the exposure of the associated field 304.

Figure 4:
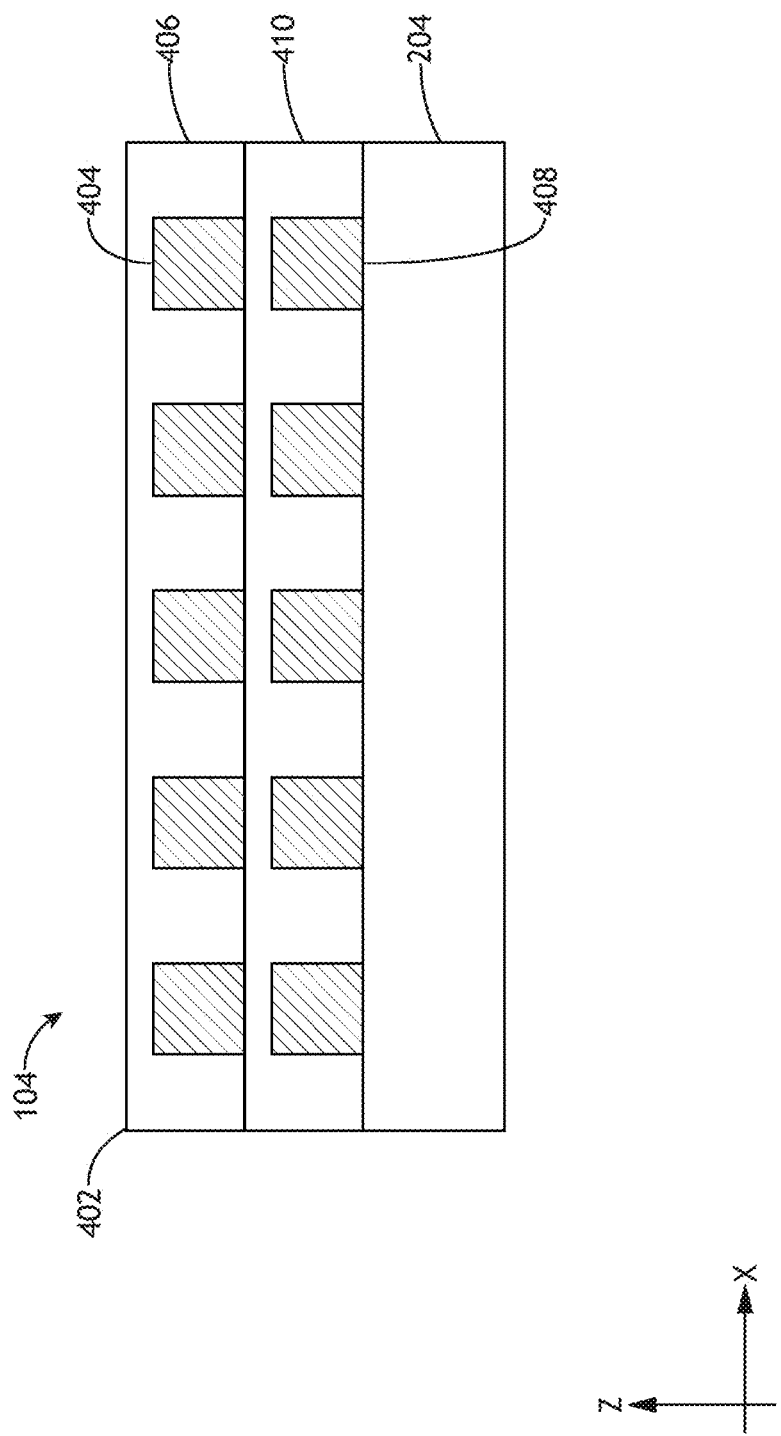
FIG. 4 is a conceptual side view of an in-die overlay target on a sample, in accordance with one or more embodiments of the present disclosure.

FIG. 4 is a conceptual side view of an in-die overlay target 402 on a sample 104, in accordance with one or more embodiments of the present disclosure. In FIG. 4, the sample 104 may include a skew training sample 302 having in-die overlay targets 402 with known programmed overlay offsets or a sample having in-die overlay targets 402 with unknown overlay offsets (e.g., a run-time sample). In some embodiments, an in-die overlay target 402 includes first-exposure features 404 associated with a first lithographic exposure on a first layer 406 of a sample 104 and second-exposure features 408 associated with a second lithographic exposure on a second layer 410 of the sample 104. FIG. 4 further illustrates a substrate 412 that may include, but is not limited to, a semiconductor wafer. Additionally, though not shown, the sample 104 may include any number of additional layers, which may be patterned or unpatterned.

The in-die overlay targets 402 may be based on an in-die overlay target design providing a nominal layout of the associated features (e.g., the first-exposure features 404 and the second-exposure features 408) associated with a condition in which the physical overlay is zero. For example, FIG. 4 illustrates a nominal layout in which the first-exposure features 404 and the second-exposure features 408 overlap (e.g., along the X direction) or are otherwise aligned. In this example, an overlay offset (e.g., either an intentional programmed overlay offset $OVL_{INT}$ or an unintended overlay offset) may correspond to a misalignment of the second-exposure features 408 with respect to the first-exposure features 404 (or vice versa) along a measurement direction of interest (e.g., the X direction). However, it is to be understood that FIG. 4 is provided solely for illustrative purposes and should not be interpreted as limiting. For example, an in-die overlay target design may provide for any number of features on any number of layers on a sample. By way of another example, the nominal condition may be any selected or arbitrary feature layout such that deviations from this layout may be considered to be overlay errors.

Figure 5:
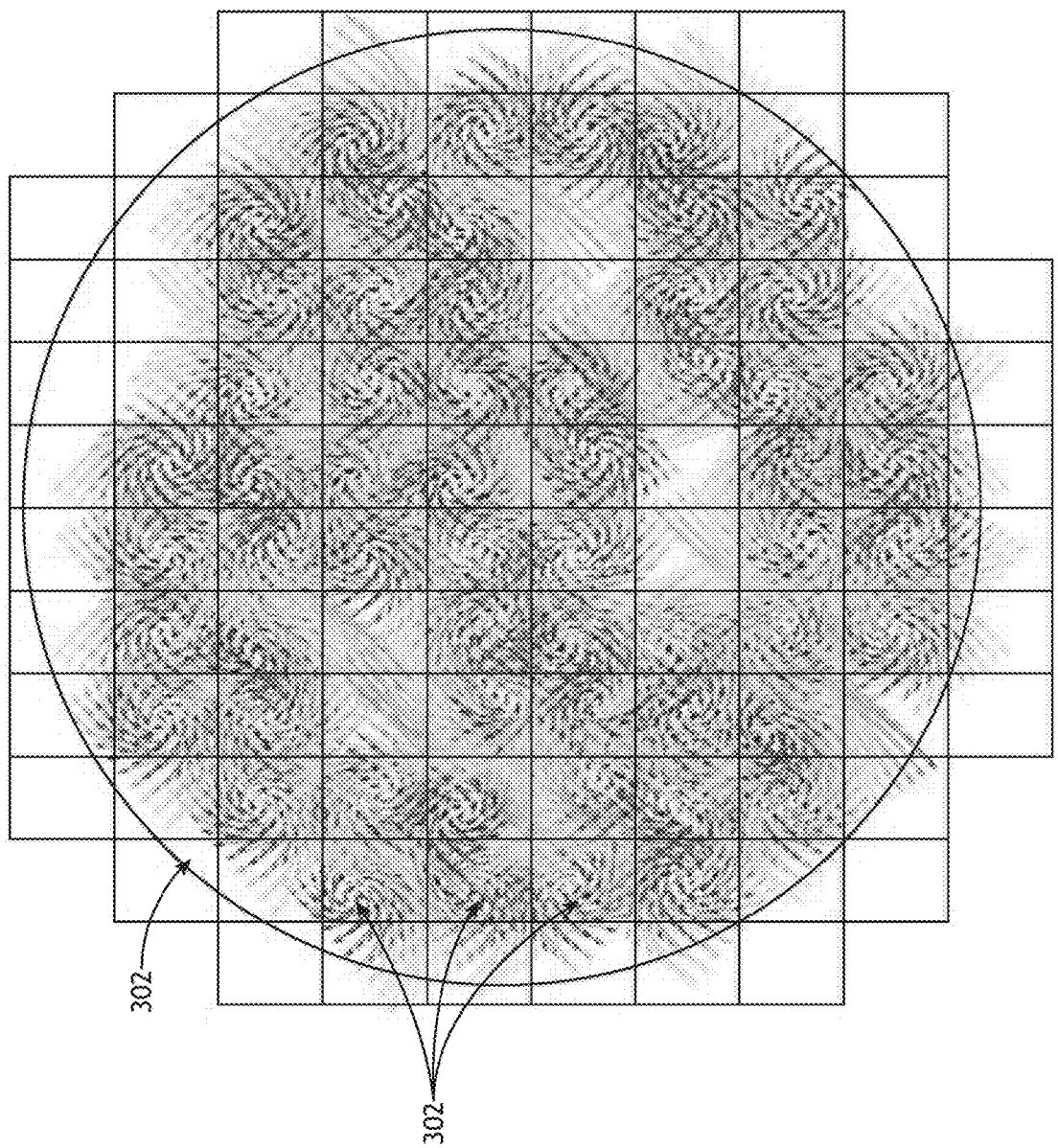
FIG. 5 is a vector map illustrating a randomized distribution of programmed overlay offsets across a skew training sample, in accordance with one or more embodiments of the present disclosure.

The programmed overlay offsets $OVL_{INT}$ of the in-die overlay targets 402 in any particular field 304 of the skew training sample 302 or across the skew training sample 302, more generally, may be distributed in any suitable pattern. In some embodiments, the programmed overlay offsets across the sample 104 are randomly distributed. FIG. 5 is a vector map illustrating a randomized distribution of programmed overlay offsets across a skew training sample 302, in accordance with one or more embodiments of the present disclosure. In FIG. 5, each arrow represents a programmed overlay offset $OVL_{INT}$, where the direction of the arrow corresponds to the direction of the programmed overlay offset and the length of the arrow corresponds to the magnitude of the overlay offset. In some embodiments, though not shown, the programmed overlay offsets are systematically varied within a selected range along one or more measurement directions within each field 304 or throughout the skew training sample 302 as a whole.

In some embodiments, the method 200 includes a step 204 of collecting overlay data for the in-die overlay targets 402 on the skew training sample 302. For example, the step 204 may include collecting overlay data for multiple in-die overlay targets 402 within each of the fields 304 across the skew training sample 302.

The overlay data may be collected using any suitable sampling plan. FIG. 6 is a schematic view of a single field 304 illustrating a sampling plan for the collection of overlay data on various in-die overlay targets 402 having various programmed overlay offsets, in accordance with one or more embodiments of the present disclosure. For example, FIG. 6 illustrates linear sampling of the field 304 along the X and Y directions. In particular, FIG. 6 illustrates a field 304 with multiple dies 602, along with a first set of measurement locations 604 along the X direction and a second set of measurement locations 606 along the Y direction. However, it is to be understood that FIG. 6 is provided solely for illustrative purposes and that step 204 may include sampling with any suitable sampling plan. As described previously herein, a particular in-die overlay target 402 may be formed as a dedicated target or from device features suitable for overlay measurements including, but not limited to, 2-dimensional sampling plans or random sampling plans. In this way, the step 204 may include collecting data from specific locations of dedicated in-die overlay targets 402 with programmed overlay offsets and/or dense sampling of device features with a distribution of programmatically varying overlay offsets.

In some embodiments, the method 200 includes a step 206 of generating asymmetric target signals for the in-die overlay targets 402 on the skew training sample 302 representative of physical overlay based on the overlay data for the in-die overlay targets 402 using an asymmetric function.

The overlay data collected in step 204 and used for the generation of asymmetric target signals in step 206 may include overlay data from any number of overlay metrology tools 102 captured using any number of measurement configurations. A measurement configuration of an overlay metrology tool 102 may generally include a set of parameters associated with the generation of overlay data. For example, in the case of an optical overlay metrology tool 102 illustrated in FIG. 1B, a measurement configuration may include a particular configuration of parameters such as, but not limited to, an angle of incidence of the illumination beam 118 (e.g., azimuth and/or polar angle of incidence), a wavelength of the illumination beam 118, a polarization of the illumination beam 118, a spot size of the illumination beam 118, a collection angle for gathering a collection signal 128 (e.g., azimuth and/or polar angles), or a polarization of the collection signal 128 (e.g., an orientation of a polarizer in the collection pathway 130).

The asymmetric function may output a single-valued asymmetric target signal for an in-die overlay target 402 based on overlay data of the in-die overlay target 402 from at least one measurement configuration of at least one overlay metrology tool 102. Further, the asymmetric function may provide an asymmetric target signal with a value of zero when the in-die overlay target 402 has a physical overlay of zero along a measurement direction, where a sign of the asymmetric target signal provided by the asymmetric function is indicative of a direction of the physical overlay of the in-die overlay target 402. For example, the asymmetric function may be written as $S_A=f(S)$, where $S_A$ is a single-valued asymmetric target signal for a particular in-die overlay target 402 and S corresponds to overlay data associated with the particular in-die overlay target 402. In this way, an asymmetric target signal $S_A$ generated by the asymmetric function may be sensitive to both the magnitude and sign of physical overlay of a fabricated in-die overlay target 402, which may be the result of intended offsets (e.g., programmed overlay offsets) and/or unintended process errors.

The asymmetric function may generally utilize overlay data of an input in-die overlay target 402 generated using any number of measurement configurations from any number of overlay metrology tools 102. Further, the asymmetric function may generate the asymmetric target signal based on a single datapoint or a combination of datapoints from any particular overlay metrology tool 102.

In some embodiments, an asymmetric function generates asymmetric target signals based on overlay data from a single measurement of an in-die overlay target 402 with a single measurement configuration of an overlay metrology tool. Continuing the non-limiting example of the optical overlay metrology tool 102 above, an asymmetric function may generate an asymmetric target signal for an in-die overlay target 402 based on overlay data including spectral data generated at a single incidence angle with selected polarization conditions for the illumination beam 118 and/or the collection signal 128 (e.g., associated with measurement of selected Mueller elements, or the like).

In some embodiments, an asymmetric function generates asymmetric target signals based on a combination of measurements from two or more measurement conditions. For example, it may be the case that a difference between overlay data collected in response to illumination with opposing azimuth angles along a measurement direction may provide an asymmetric target signal for that measurement direction. Further, an asymmetric signal may be generated based on a mathematical combination of overlay data associated with one or more measurement conditions such as, but not limited to, a sum, a difference, an average, a principal component analysis, or the like.

Figure 7A:
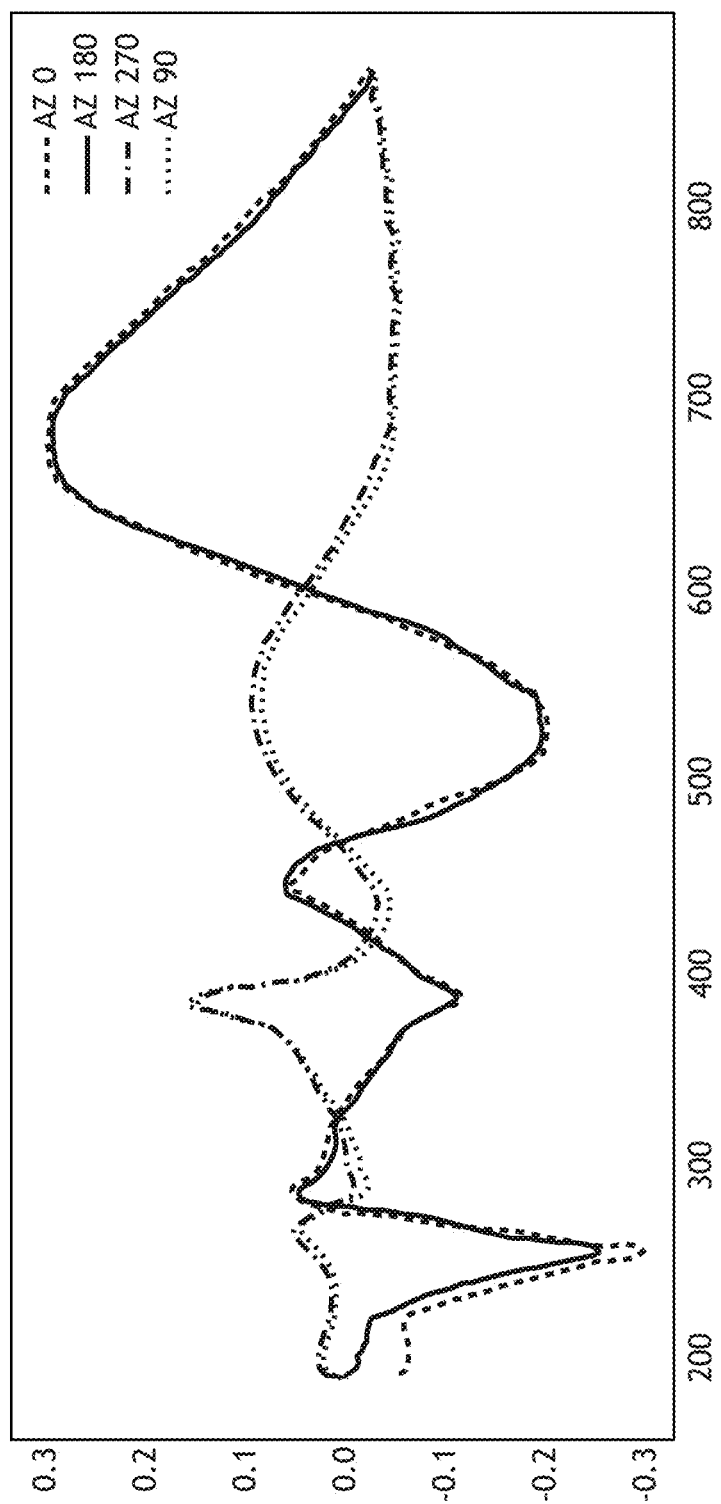
FIG. 7A is a plot of overlay data of an in-die overlay target with non-zero physical overlay generated with illumination at four evenly-spaced azimuth angles across a range of wavelengths, in accordance with one or more embodiments of the present disclosure.
Figure 7B:
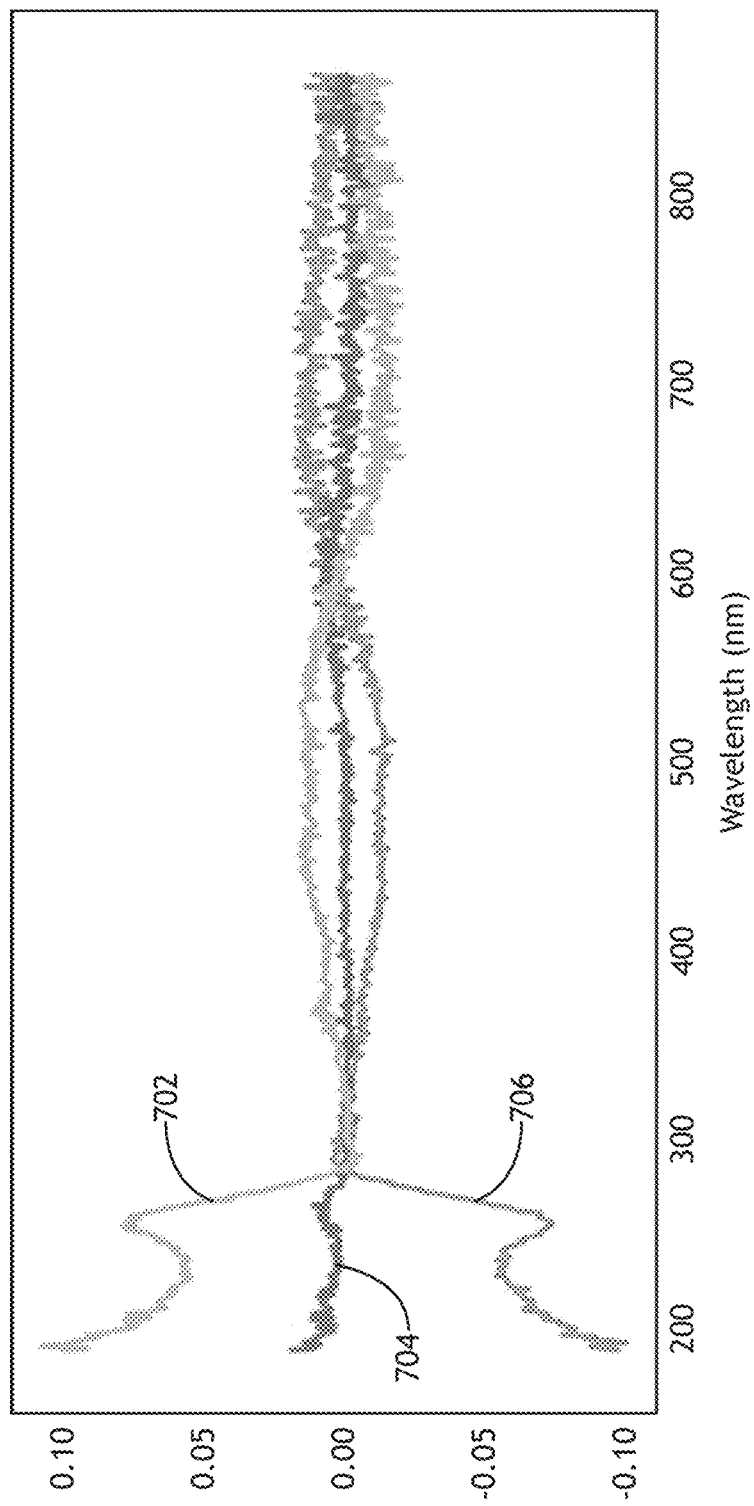
FIG. 7B is a plot of differential signals generated by subtracting overlay data with opposing azimuth angles for three in-die overlay targets with different physical overlays, in accordance with one or more embodiments of the present disclosure.
Figure 7C:
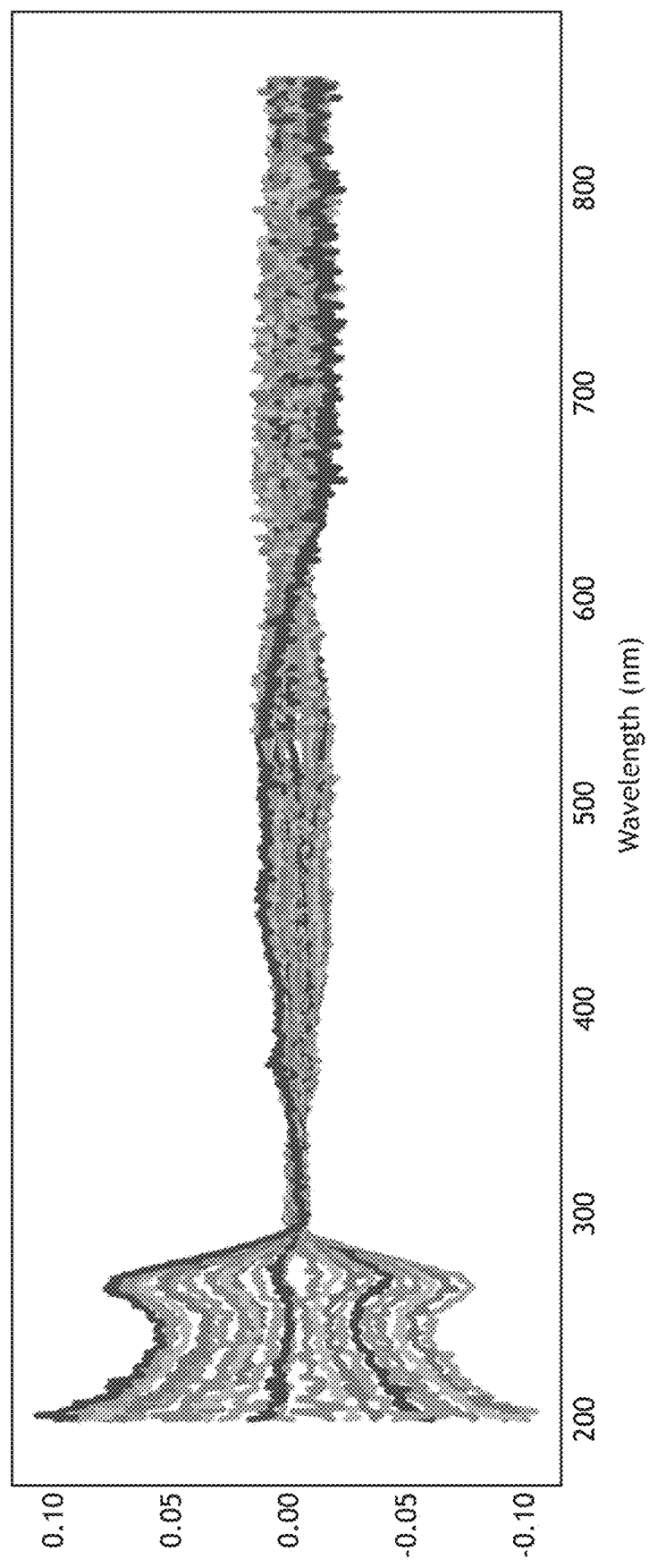
FIG. 7C is a plot of differential signals generated in the same manner as for FIG. 7B over a range of physical overlay values spanning a nominal overlay value of zero, in accordance with one or more embodiments of the present disclosure.
Figure 8:
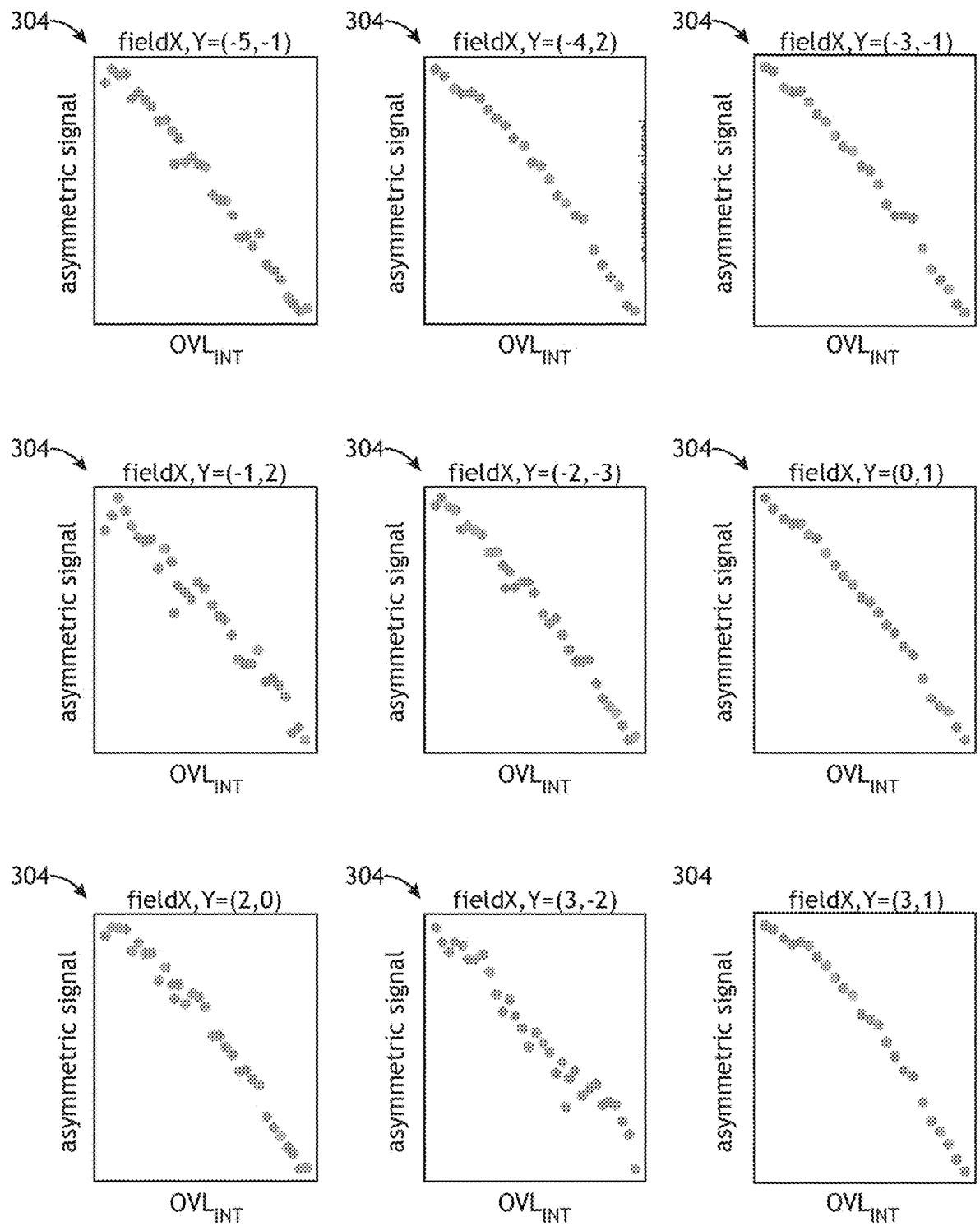
FIG. 8 includes plots of asymmetric target signals for various fields across the skew training sample of FIG. 3 as a function of the programmed overlay offsets within the fields, in accordance with one or more embodiments of the present disclosure.

FIGS. 7A through 8 illustrate non-limiting examples of the generation of asymmetric target signals for an in-die overlay target 402 using a Mueller ellipsometer configured according to FIG. 1B. FIG. 7A is a plot of overlay data of an in-die overlay target 402 with non-zero physical overlay generated with illumination at four evenly-spaced azimuth angles (e.g., AZ 0, AZ 90, AZ 180, and AZ 270 degrees) across a range of wavelengths, in accordance with one or more embodiments of the present disclosure. As illustrated in FIG. 7A, overlay data at opposing azimuth angles (e.g., 0 and 180 degrees associated with an X direction or 90 and 270 degrees associated with a Y direction) are generally similar, but exhibit differences induced by the non-zero physical overlay of the structures. Accordingly, an asymmetric function may generate an asymmetric signal by generating a difference signal through subtracting the overlay data at opposing azimuth angles.

FIG. 7B is a plot of differential signals generated by subtracting overlay data with opposing azimuth angles for three in-die overlay targets 402 with different physical overlays, in accordance with one or more embodiments of the present disclosure. In particular, FIG. 7B illustrates a first difference signal 702 for an in-die overlay target 402 with a physical overlay of −6 nm, a second difference signal 704 for an in-die overlay target 402 with a physical overlay of −0.1 nm, and a third difference signal 706 for an in-die overlay target 402 with a physical overlay of +6 nm, all along the X direction, which are generated by subtracting overlay data at opposing azimuth angles along the X direction (e.g., 0 and 180 degrees) under conditions similar to those used to generate FIG. 7A. In FIG. 7B, difference signals associated with physical overlay value in opposite directions (e.g., the first difference signal 702 and the third difference signal 706) are mirror symmetric (e.g., have opposite signs). Further, the magnitudes of the difference signals scale with the physical overlay. For example, the second difference signal 704 associated with an overlay of −0.1 nm has approximately the same shape as the first difference signal 702 associated with a physical overlay of −6 nm, but with a lower magnitude.

FIG. 7C is a plot of differential signals generated in the same manner as for FIG. 7B over a range of physical overlay values spanning a nominal overlay value of zero, in accordance with one or more embodiments of the present disclosure. In FIG. 7C, the magnitude of a difference signal associated with opposing azimuth angles scales with the physical overlay, and the sign is indicative of the direction of the physical overlay. In this way, an asymmetric function may generate asymmetric target signals based on such difference signals. In some embodiments, an asymmetric target signal corresponds to a difference signal associated with a single wavelength. For example, the difference signals in FIGS. 7B and 7C in a wavelength range from approximately 200-300 nm are particularly sensitive to physical overlay variations. Accordingly, an asymmetric target signal may correspond to a value of a difference signal associated with a selected wavelength in that range. In some embodiments, an asymmetric target signal corresponds to a mathematical combination of difference signal data from multiple wavelengths such as, but not limited to, a sum, a square root of a sum, an average, a principal component analysis, or the like. For example, an asymmetric signal may correspond to a sum of difference signal data for selected wavelengths (e.g., wavelengths in the range of 200-300 nm, an entire measured wavelength range, or the like).

In some embodiments, the step 206 (or the method 200 more generally) may include identifying one or more measurement conditions from one or more overlay metrology tools 102 providing overlay data sensitive to physical overlay. Further, the step 206 may include identifying one or more measurement conditions from one or more overlay metrology tools 102 providing overlay data that is insensitive to other target parameters (e.g., sidewall angle, feature asymmetry, or the like). In this way, the values of the asymmetric target signals may provide a sensitive indication of physical overlay on an in-die overlay target 402.

It is contemplated herein that measurement conditions of one or more overlay metrology tools 102 providing overlay data sensitive to overlay (and potentially insensitive to other target variations) may be determined using a variety of techniques. In some embodiments, the measurement configurations are determined using a design of experiments in which overlay data associated with a series of measurement conditions is captured either experimentally or through simulations for a series of in-die overlay targets 402 with programmed overlay and possibly other target variations. In this way, the overlay data providing a desired sensitivity to overlay may be identified based on the design of experiments. Further, this technique may be used to identify an asymmetric function suitable for generating asymmetric target signals based on the overlay data. For example, multiple mathematical combinations (e.g., sum, square root of sum, average, principal component analysis, or the like) of portions of the overlay data may be performed to identify a suitable asymmetric function.

In some embodiments, a machine-learning model is trained to identify the measurement conditions providing overlay data sensitive to overlay and insensitive to other target variations. For example, overlay data may be generated either through experiments or simulations for a first series of in-die overlay targets 402 where only the overlay is modified and for a second series of in-die overlay targets 402 in which multiple target parameters are varied. This overlay data for the first series and second series of in-die overlay targets 402 may then be used to train a machine-learning model to identify a subset of the considered measurement conditions providing overlay data sensitive to overlay and insensitive to other target variations (e.g., based on selected thresholds).

Further, this machine-learning model may be implemented in various ways in the context of the method 200. In some embodiments, the steps of identifying the measurement conditions providing overlay data sensitive to overlay and insensitive to other target variations may be performed prior to collection of overlay data from the skew training sample 302. In this way, the step 204 may be performed with relatively high throughput. In some embodiments, the step 204 includes the collection of overlay data with multiple measurement conditions from the skew training sample 302 followed by the identification of the measurement conditions providing overlay data sensitive to overlay and insensitive to other target variations using the machine-learning model. In this way, only the overlay data associated with these measurement conditions is utilized in subsequent steps or stored for additional training purposes.

Referring now to FIG. 8, FIG. 8 includes plots of asymmetric target signals for various fields 304 across the skew training sample 302 of FIG. 3 as a function of the programmed overlay offsets within the fields 304, in accordance with one or more embodiments of the present disclosure. For example, each datapoint in FIG. 8 corresponds to a single-valued asymmetric target signal for a particular in-die overlay target 402 with a particular programmed overlay offset $OVL_{INT}$, where the asymmetric function generates the single-valued asymmetric target signals ($S_A$) by summing difference signal data associated with opposing azimuth angles across a range of wavelengths (e.g., summing difference signal data similar to that illustrated in FIGS. 7B and 7C to get a single-valued signal for each in-die overlay target 402). Further, each of the plots in FIG. 8 is labeled with field coordinates (e.g., "fieldX,Y=(−5,0)" or the like) indicative of the location of the particular field 304 on the skew training sample 302 along X and Y directions. As illustrated in FIG. 8, the asymmetric target signals may scale linearly with the programmed overlay offset within each field 304.

It is to be understood, however, that FIGS. 7A-8 are provided solely for illustrative purposes and should not be interpreted as limiting. For example, asymmetric target signals sensitive to both the direction and magnitude of physical overlay may be generated based on overlay data generated by any suitable overlay metrology tool 102 and may correspond to any selected measurement conditions or combinations thereof.

Referring again to FIG. 2, in some embodiments, the method 200 includes a step 208 of generating corrected overlay offsets for the in-die overlay targets 402 on the skew training sample 302 based on the asymmetric target signals for the various in-die overlay targets 402. It is contemplated herein that the programmed skew offsets for the various fields 304 and/or unintended process variations during the fabrication of the skew training sample 302 may result in overlay offset errors. As a result, the physical overlay of the in-die overlay targets 402 within a particular field 304 may differ from the programmed overlay offsets ($OVL_{INT}$). However, since the asymmetric function from step 206 is designed to provide a value of zero when the physical overlay is zero (e.g., $S_A=0$), the asymmetric target signals may be used to generate a correction function $C(S_A, OVL_{INT})$ for each field to correct the programmed overlay offsets. For example, a corrected overlay offset ($OVL_C$) may be generally written as:

$$OVL_C = OVL_{INT} - C(S_A, OVL_{INT}). \quad (1)$$

In some embodiments, the step 208 includes determining a value of a programmed overlay offset for each field 304 of the skew training sample 302 providing an asymmetric target signal of zero (e.g., $S_A=0$), which is referred to herein as a field-zero programmed overlay offset ($OVL_{INT,0}$), and calculating corrections to the programmed overlay offsets based on this field-zero programmed overlay offset. For example, Eq. (1) may be written as:

$$OVL_C = OVL_{INT} - OVL_{INT,0} \quad (2)$$

It is contemplated that this approach may be suitable for, but is not limited to, asymmetric functions (e.g., from step 206) providing a linear relationship between asymmetric target signals and physical overlay.

Figure 9:
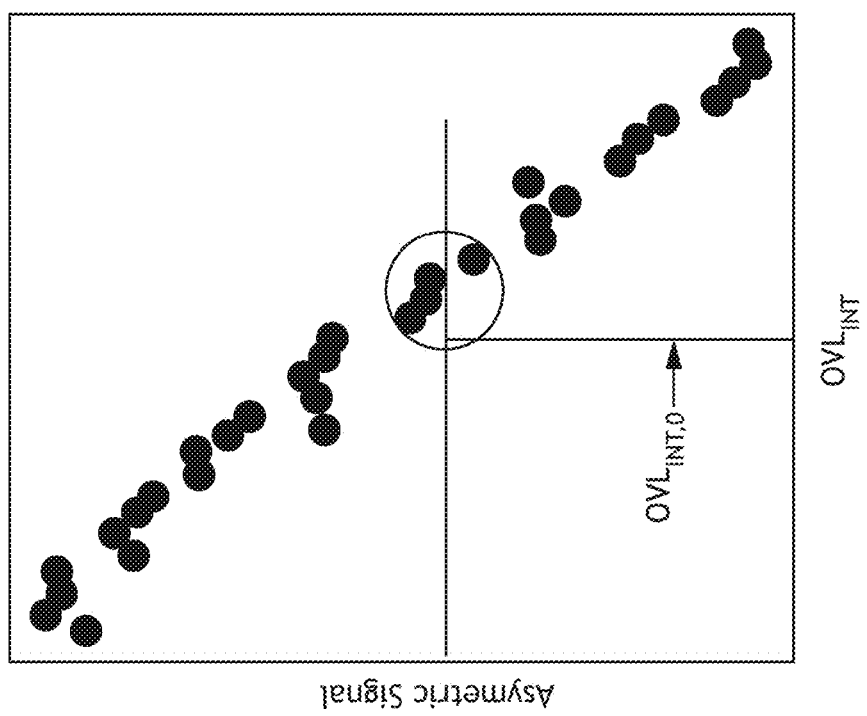
FIG. 9 is a plot of the asymmetric target signals as a function of the programmed overlay offsets for in-die overlay targets within a field on a skew training sample, in accordance with one or more embodiments of the present disclosure.

As an illustration, FIG. 9 is a plot of the asymmetric target signals ($S_A$) as a function of the programmed overlay offsets ($OVL_{INT}$) for in-die overlay targets 402 within a field 304 on a skew training sample 302, in accordance with one or more embodiments of the present disclosure. In particular, the plot in FIG. 9 corresponds to the fieldX,Y=(−5,−1) from FIG. 8. The field 304 corresponding to the data in FIG. 9 includes in-die overlay targets 402 with programmed overlay offsets spanning a selected range around zero overlay (here, spanning a range of approximately −10 to 10 arbitrary units of programmed overlay offset), and the asymmetric target signals ($S_A$) vary linearly as a function of the programmed overlay offset. However, the in-die overlay target 402 with a programmed overlay offset ($OVL_{INT}$) of zero has a non-zero asymmetric target signal, indicating that the physical overlay offsets of the in-die overlay targets 402 in this field 304 differ from the programmed overlay offsets.

The field-zero programmed overlay offset ($OVL_{INT,0}$) may then correspond to a value of the programmed overlay offset providing $S_A=0$. It is contemplated herein that the field-zero programmed overlay offset may be determined in a variety of ways within the spirit and scope of the present disclosure. In some embodiments, the field-zero programmed overlay offset is determined by generating a relationship between the programmed overlay offsets and the asymmetric signals in each field 304 and determining the field-zero programmed overlay offset based on this relationship. For example, the field-zero programmed overlay offset may be determined by generating a fitting function (e.g., a linear or non-linear fitting function) relating the asymmetric target signals to the programmed overlay offsets in each field 304 (e.g., using data similar to that illustrated in FIGS. 8 and 9) and then determining the field-zero programmed overlay offset based on this fitting function. In some embodiments, the field-zero programmed overlay offset is verified or fully determined through one or more additional overlay measurements. For example, the field-zero programmed overlay offset may be verified or determined through overlay measurements of one or more in-die overlay targets 402 (e.g., those having asymmetric target signals near zero) with an overlay metrology tool 102 having a higher resolution than the one used to generate the asymmetric target signals such as, but not limited to, an electron-beam overlay metrology tool 102.

The corrected overlay offsets ($OVL_C$) for in-die overlay targets 402 within each field 304 may then be, but is not required to be, generated based on the field-zero programmed overlay offset based on Eq. (2) or more generally based on Eq. (1).

Referring again to FIG. 2, in some embodiments, the method 200 includes a step 210 of generating self-calibrated overlay offsets ($OVL_{SELF-CAL}$) based on the programmed overlay offsets ($OVL_{INT}$) and the associated corrected overlay offsets ($OVL_C$) for the in-die overlay targets 402 within the various fields 304 on the skew training sample 302. For example, the slopes of the asymmetric target signals as a function of programmed overlay offset ($OVL_{INT}$) within the various fields 304 may differ. This is illustrated, for instance, in the varied slopes present in FIG. 8. However, the self-calibrated overlay offsets ($OVL_{SELF-CAL}$) may utilize a statistical combination of data from the various fields 304 to provide an accurate and robust overlay determination. In particular, whereas the self-calibrated overlay offsets ($OVL_{SELF-CAL}$) may calibrate the slopes of the asymmetric target signals in addition to the field offsets. It is contemplated herein that self-calibrated overlay offsets ($OVL_{SELF-CAL}$) based on in-die overlay targets 402 across the entire skew training sample 302 may provide a more accurate correction of the actual physical overlay across the skew training sample 302 than the corrected overlay offsets ($OVL_C$) based only on in-die overlay targets 402 within each of the fields 304.

In some embodiments, the step 210 includes fitting the programmed overlay offset ($OVL_{INT}$) and associated corrected overlay offsets ($OVL_C$) for various in-die overlay targets 402 on the skew training sample 302 to a composite correction function. For example, the composite correction function 1002 may correspond to a linear fitting function of the programmed overlay offset (OVL$_{INT}$) and the associated corrected overlay offsets (OVL$_C$), which may be written as:

$$OVL_{SELF-CAL} = A \cdot OVL_{INT} + 0, \quad (3)$$

where A is a fitted value of the slope and 0 is a fitted y-offset value.

Figure 10:
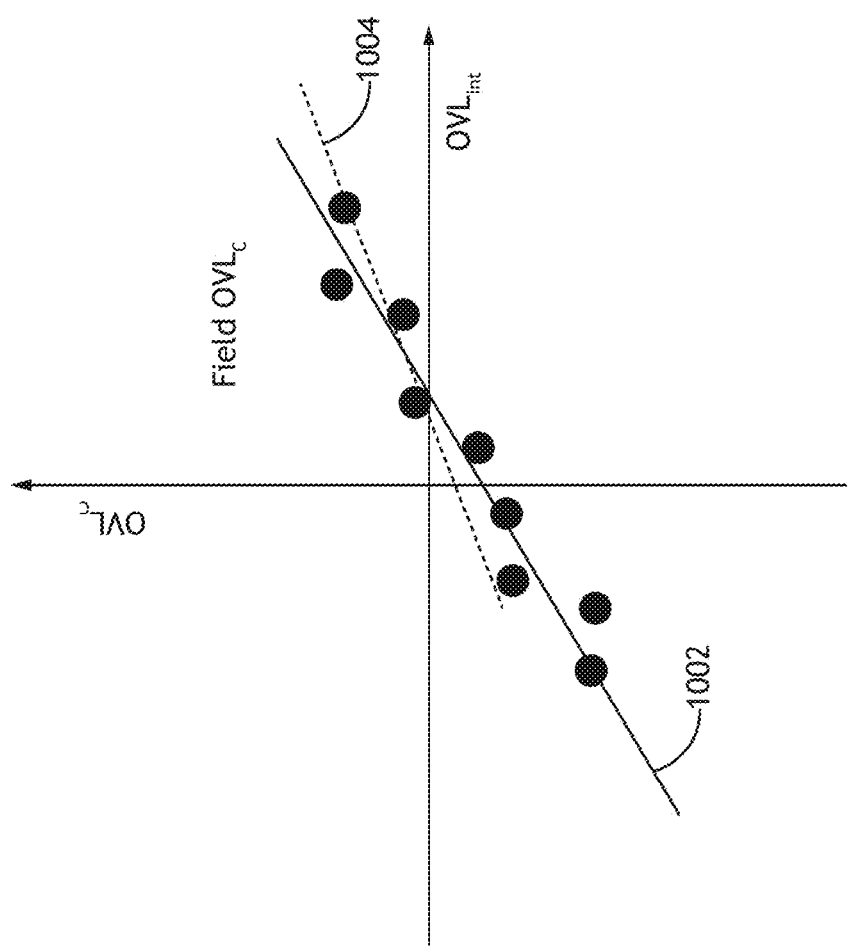
FIG. 10 is a plot of a linear composite correction function based on programmed overlay offset and associated corrected overlay offsets for various in-die overlay targets on the skew training sample, in accordance with one or more embodiments of the present disclosure.

As an illustration, FIG. 10 is a plot of a linear composite correction function 1002 based on programmed overlay offset (OVL$_{INT}$) and associated corrected overlay offsets (OVL$_C$) for various in-die overlay targets 402 on the skew training sample 302, in accordance with one or more embodiments of the present disclosure. FIG. 10 further illustrates a particular within-field slope 1004 associated with a correction function C(S$_A$, OVL$_{INT}$) of a particular field 304, which differs from the slope (A) of the composite correction function 1002. In this way, the slope (A) of the composite correction function 1002 of step 210 may be a statistical combination of the slopes associated with the per-field correction functions C(S$_A$, OVL$_{INT}$), which may provide more accurate and/or robust overlay determinations.

In some embodiments, the step 210 further includes evaluating the composite correction function (e.g., the composite correction function 1002, or the like) with the values of the programmed overlay offsets (OVL$_{INT}$) for the various in-die overlay targets 402 across the skew training sample 302 to generate the values of the self-calibrated overlay offsets (OVL$_{SELF-CAL}$).

It is further contemplated herein that uncertainties in the programmed overlay offsets (OVL$_{INT}$) (e.g., associated with uncertainties associated with a lithography tool) may tend to decrease the robustness of the determination of self-calibrated overlay values based on step 208 and step 210 of the method 200 described above.

In some embodiments, the self-calibrated overlay offsets (OVL$_{SELF-CAL}$) are calculated by iteratively refining the per-field correction functions C(S$_A$, OVL$_{INT}$) (e.g., originally determined in step 208). For example, the slope (A) of a composite correction function may be iteratively determined to ensure convergence. In this way, the self-calibrated overlay offsets (OVL$_{SELF-CAL}$) may be robust to uncertainties in the programmed overlay offsets.

Continuing the example of the linear composite correction function above, the slope (A) at a $0^{th}$ iteration may be written as:

$$A_0 = slope(OVL_{INT,M}, OVL_{INT,M} - C_0(S_A, OVL_{INT})), \quad (4)$$

where OVL$_{INT}$ is a programmed overlay offset of the lithography tool, OVL$_{INT,M}$ is the per-field programmed overlay offset of a particular in-die overlay target 402 (e.g., OVL$_{INT,M}$ may be characterized as the field mean of the programmed overlay offset), and C$_0$(S$_A$, OVL$_{INT}$) is the $0^{th}$ iteration of the per-field correction function for the associated field 304 including the particular in-die overlay target 402.

Eq. (4) may further be rearranged using covariance and variance functions such as:

$$A_0 = \frac{Cov(OVL_{INT,M}, OVL_{INT,M} - C_0(S_A, OVL_{INT}))}{Var(OVL_{INT,M})} = \quad (5)$$

$$\frac{Cov(OVL_{INT,M}, OVL_{INT,M}) - Cov(OVL_{INT,M}, C_0(S_A, OVL_{INT}))}{Var(OVL_{INT,M})} =$$

$$1 - \frac{Cov(OVL_{INT,M}, C_0(S_A, OVL_{INT}))}{Var(OVL_{INT,M})} = 1 - K$$

Similarly, iterative versions of the slope may be determined as:

$$A_1 = 1 - \frac{Cov(OVL_{INT,M}, C_1(S_A, OVL_{INT}))}{Var(OVL_{INT,M})} = \quad (6)$$

$$1 - \frac{Cov(OVL_{INT,M}, A_0 \cdot C_1(S_A, OVL_{INT}))}{Var(OVL_{INT,M})} = 1 - A_0 \cdot K$$

$$A_2 = 1 - \frac{Cov(OVL_{INT,M}, C_2(S_A, OVL_{INT}))}{Var(OVL_{INT,M})} = \quad (7)$$

$$1 - \frac{Cov(OVL_{INT,M}, A_0 \cdot A_1 \cdot C_2(S_A, OVL_{INT}))}{Var(OVL_{INT,M})} = 1 - A_0 \cdot A_1 \cdot K$$

$$A_n = 1 - A_0 \cdot A_1 \ldots A_{n-1} \cdot K \quad (8)$$

In some embodiments, the slope (A) is iteratively calculated until a convergence criterion is satisfied. It is contemplated herein that various convergence criterion may be used within the spirit and scope of the present disclosure. For example, a convergence criterion may include a condition at which a difference between values between successive iterations is less than a selected threshold.

Figure 11:
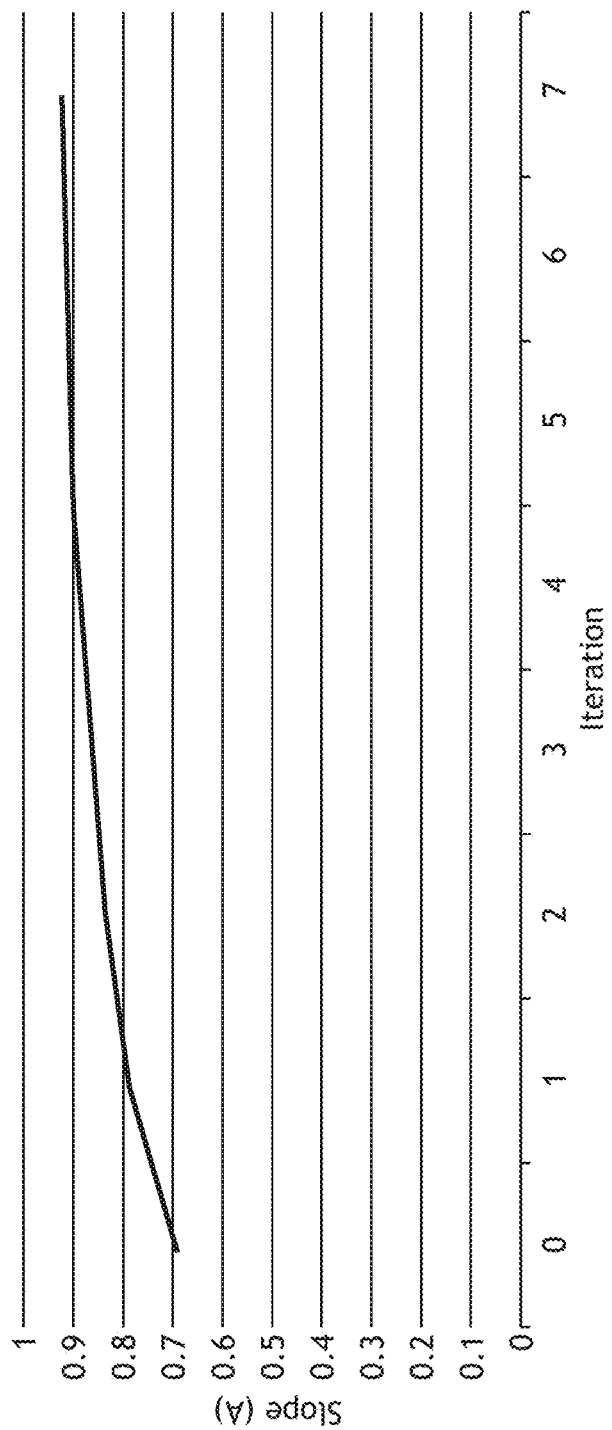
FIG. 11 is a plot illustrating the convergence of the slope of a linear composite correction function, in accordance with one or more embodiments of the present disclosure.

As an illustration, FIG. 11 is a plot illustrating the convergence of the slope (A) of a linear composite correction function, in accordance with one or more embodiments of the present disclosure.

Referring again to FIG. 2, in some embodiments, the method 200 includes a step 212 of training an overlay recipe to provide an overlay measurement based on overlay data from the one or more overlay metrology tools as inputs, where training data for training the overlay recipe includes at least the overlay data of the in-die overlay targets on the skew training sample and the self-calibrated overlay offsets. In some embodiments, the method 200 includes a step 214 of generating one or more additional overlay measurements for one or more additional in-die overlay targets on one or more additional samples using the trained overlay recipe. In this way, the self-calibrated overlay offsets provided by the skew training sample 302 may accurately reflect the actual physical overlay offsets such that the associated overlay data may provide an accurate and robust training dataset for the overlay recipe. This overlay recipe, once trained, may then provide accurate and robust overlay measurements on additional in-die overlay targets having unknown overlay characteristics.

The overlay recipe may utilize various data fitting and optimization techniques such as, but not limited to, machine-learning algorithms (e.g., machine learning libraries, linear machine learning models, neural networks, convolutional networks, support-vector machines (SVM), or the like), dimensionality-reduction algorithms (e.g., PCA (principal component analysis), ICA (independent component analysis), LLE (local-linear embedding), or the like), fast-reduced-order models, regression, sparse representation (e.g., Fourier transform techniques, wavelet transform techniques, or the like), Kalman filters, or algorithms to promote matching from same or different tool types. Further, statistical model-based metrology is generally described in U.S. Pat. No. 10,101,670, which is incorporated herein by reference in its entirety. By way of another example, the device overlay data may be analyzed by algorithms that do not include modeling, optimization and/or fitting such as patterned wafer characterization which is generally described in U.S. Patent Publication No. 2015/0046121, and which is incorporated herein by reference in its entirety.

In some embodiments, the overlay recipe includes modeling or simulation of the optical interaction of the illumination beam 118 with the sample 104. For example, optical interaction of the incident beam with the sample may be modeled using EM (electro-magnetic) solver, which may utilize various modeling techniques including, but not limited to, rigorous coupled-wave analysis (RCWA), finite element method (FEM), method of moments, surface integral methods, volume integral methods, or finite-different time-domain (FDTD) techniques. Further, the in-die overlay target may be modeled (e.g., parametrized) using a geometric engine, a process modeling engine, or a combination of both. The use of process modeling is described generally in U.S. Patent Publication 20140172394, which is incorporated herein by reference in its entirety. A geometric engine is implemented, for example, in AcuShape software product of KLA Corp.

Additionally, the overlay recipe may generally be trained or retrained at any suitable time. For example, the overlay recipe may be trained (e.g., in step 212) during an initial recipe setup prior to run-time measurements of the additional samples. By way of another example, the overlay recipe may be retrained (e.g., using newly collected data) during run-time. Further, the overlay recipe may generally be trained using any suitable training data. For example, the training data may further include synthetically-generated overlay data from a parameterized overlay model and/or overlay data from nominal in-die overlay targets on one or more additional samples.

Figure 12A:
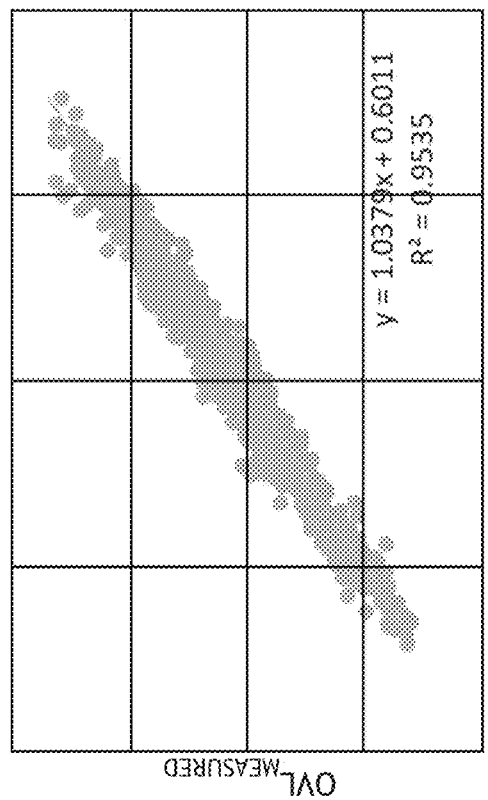
FIG. 12A is a plot of self-calibrated overlay offsets as a function of physical overlay as measured with an SEM overlay metrology tool, in accordance with one or more embodiments of the present disclosure.
Figure 12B:
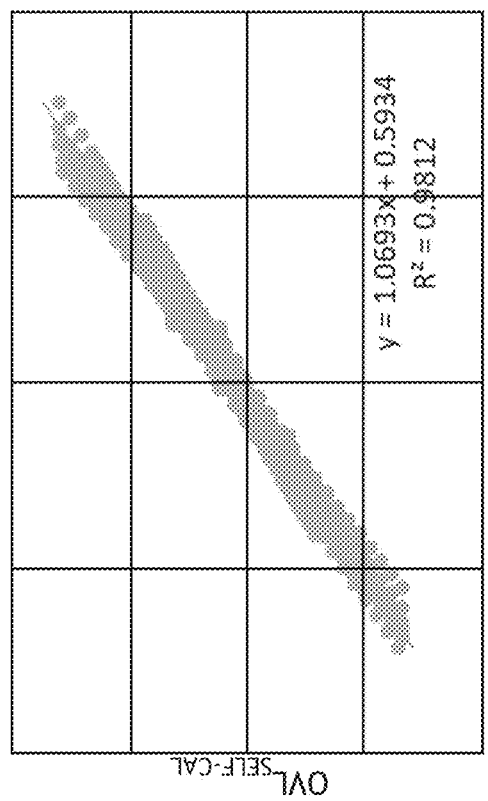
FIG. 12B is a plot of overlay measurements on in-die overlay targets with unknown overlay characteristics generated with an overlay recipe trained with the overlay data and the associated self-calibrated overlay offsets using the method, in accordance with one or more embodiments of the present disclosure.

FIGS. 12A and 12B illustrate the accuracy of the method 200 based on verification using an SEM overlay metrology tool 102. FIG. 12A is a plot of self-calibrated overlay offsets ($OVL_{SELF-CAL}$) as a function of physical overlay as measured with an SEM overlay metrology tool 102, in accordance with one or more embodiments of the present disclosure. In FIG. 12A, the self-calibrated overlay offsets determined using the method 200 provide highly accurate representations of the physical overlay of the various in-die overlay targets 402 on the skew training sample 302 despite the presence of the programmed skew offsets, which indicates that the self-calibrated overlay offsets determined using the method 200 are highly robust to process variations of a lithography tool during fabrication. FIG. 12B is a plot of overlay measurements on in-die overlay targets with unknown overlay characteristics ($OVL_{MEASURED}$) generated with an overlay recipe trained with the overlay data and the associated self-calibrated overlay offsets using the method 200, in accordance with one or more embodiments of the present disclosure. In particular, the overlay recipe used to generate the data in FIG. 12B incorporates a signal response metrology (SRM) technique. Further, the overlay data ($OVL_{MEASURED}$) in FIG. 12B is plotted as a function of actual physical overlay as measured with an SEM overlay metrology tool 102. As illustrated in FIG. 12B, an overlay recipe trained with self-calibrated overlay measurements and associated overlay data from one or more overlay metrology tools 102 may provide a highly accurate and robust overlay measurement, even in the presence of process variations.

Figure 13:
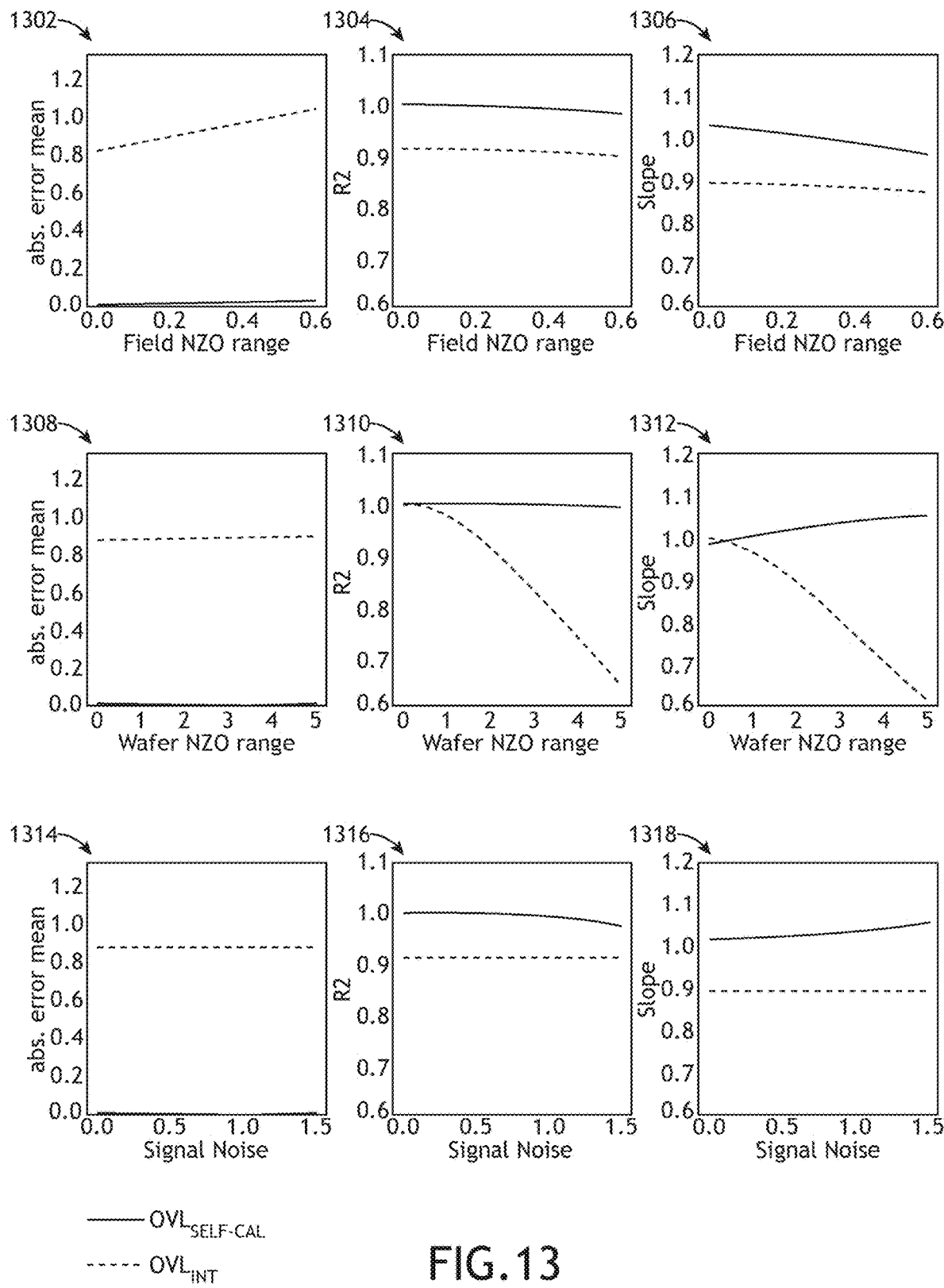
FIG. 13 includes simulated plots of a mean absolute error, $R^2$, and slope of fitting data relating overlay measurements taken with a trained overlay recipe and verified physical overlay data as a function of field NZO variations, wafer NZO variations, and signal noise, in accordance with one or more embodiments of the present disclosure.

Referring now to FIG. 13, it is contemplated herein that an overlay recipe trained with self-calibrated overlay measurements and associated overlay data from a skew training sample 302 may be robust to various sources of error such as, but not limited to, on-field non-zero offset (NZO) variations, wafer NZO variations, or signal noise. NZO may refer to differences between overlay data generated at different fabrication stages and/or by different tools. For example, NZO may refer to, but is not required to refer to, a difference between after-development inspection (ADI) overlay data and after-etch inspection (AEI) overlay data. FIG. 13 includes simulated plots of a mean absolute error, $R^2$, and slope of fitting data relating overlay measurements taken with a trained overlay recipe (e.g., associated with the method 200) and verified physical overlay data as a function of field NZO variations (plots 1302,1304,1306), wafer NZO variations (plots 1308,1310,1312), and signal noise (plots 1314,1316,1318), in accordance with one or more embodiments of the present disclosure. In this way, the plots in FIG. 13 are representative of fitting data similar to that illustrated in FIG. 12B for samples with known field NZO variations, wafer NZO variations, and signal noise. Further, the true overlay in these simulations is based on programmed overlay offsets ($OVL_{INT}$), field NZO variations, wafer NZO variations, and global offsets. Further, the asymmetric signals (e.g., associated with step 206) are based on the true overlay plus random measurement noise. It is found that training an overlay recipe with self-calibrated overlay data as disclosed herein is robust to various noise sources. In particular, FIG. 13 illustrates approximately zero error mean along with good $R^2$ and slope values even in the presence of significant sources of error.

Referring again to FIG. 1A-1D, various aspects of the overlay metrology system 100 are described in greater detail, in accordance with one or more embodiments of the present disclosure.

The one or more processors 110 of the controller 108 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 110 may include any device configured to execute algorithms and/or instructions (e.g., program instructions stored in memory). In some embodiments, the one or more processors 110 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure. Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 108 may include one or more controllers housed in a common housing or within multiple housings. In this way, any controller or combination of controllers may be separately packaged as a module suitable for integration into overlay metrology system 100.

The memory device 112 may include any storage medium known in the art suitable for storing program instructions executable by the associated one or more processors 110. For example, the memory device 112 may include a non-transitory memory medium. By way of another example, the memory device 112 may include, but is not limited to, a read-only memory (ROM), a random-access memory (RAM), a magnetic or optical memory device (e.g., disk), a magnetic tape, a solid-state drive and the like. It is further noted that the memory device 112 may be housed in a common controller housing with the one or more processors 110. In some embodiments, the memory device 112 may be located remotely with respect to the physical location of the one or more processors 110 and the controller 108. For instance, the one or more processors 110 of the controller 108 may access a remote memory (e.g., server), accessible through a network (e.g., internet, intranet and the like).

In one embodiment, the memory device 112 includes a data server. For example, the data server may collect data from the overlay metrology tool 102 or other external tools associated with the in-die overlay targets 402 on the skew training sample 302 and/or additional samples at any processing step or steps (e.g., ADI steps, AEI steps, ACI steps, or the like). The data server may also store the programmed overlay offsets ($OVL_{INT}$), the corrected overlay offsets ($OVL_C$), and/or the self-calibrated overlay offsets ($OVL_{SELF-CAL}$) for the in-die overlay targets 402 on the skew training sample 302. The data server may further store any additional training data suitable for training the overlay recipe (e.g., in step 212 of the method 200). In this way, the overlay recipe may be trained by any suitable training data located on the data server.

In some embodiments, the controller 108 trains or retrains the overlay recipe (e.g., as part of step 212 or as a part of a subsequent retraining step) using suitable training data, which may be, but is not required to be, located on a data server. Additionally, the controller 108 may operate as a recipe manager and may distribute the overlay recipe (e.g., trained and/or retrained versions thereof) to suitable tools or systems. The controller 108 may further generate correctables based on overlay data (e.g., from additional samples generated with a trained overlay recipe) to provide feedback and/or feed-forward control of any process tool.

Figure 1C:
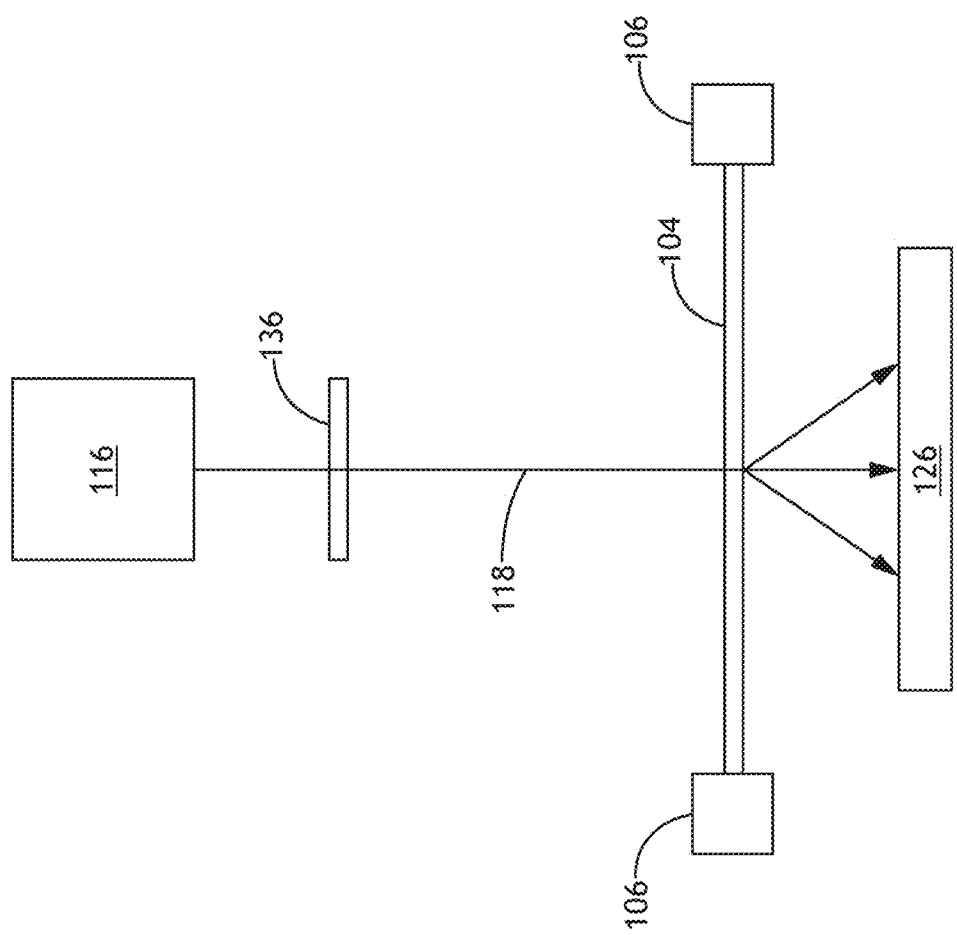
FIG. 1C is a conceptual view of the overlay metrology tool configured as an x-ray tool, in accordance with one or more embodiments of the present disclosure.
Figure 1D:
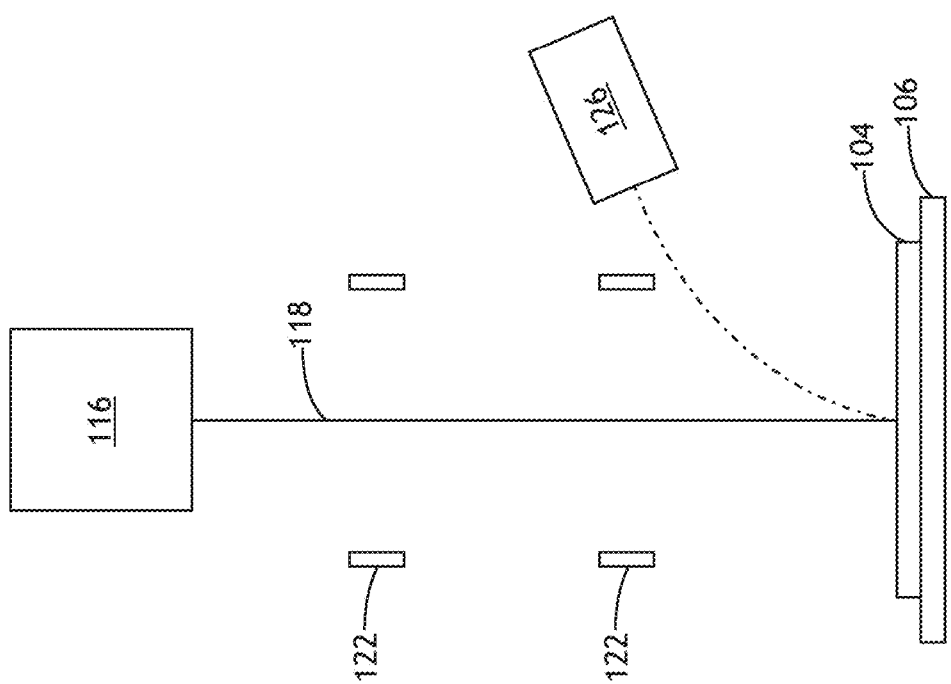
FIG. 1D is a conceptual view of the overlay metrology tool configured as a particle-beam metrology tool, in accordance with one or more embodiments of the present disclosure.

Referring now to FIGS. 1C and 1D, various additional configurations of the overlay metrology tool 102. It is thus to be understood that FIG. 1B and the associated description are provided solely for illustrative purposes and should not be interpreted as limiting. Further, the overlay metrology system 100 may include more than one overlay metrology tool 102 and/or an overlay metrology tool 102 suitable for providing multiple types of overlay metrology data.

FIG. 1C is a conceptual view of the overlay metrology tool 102 configured as an x-ray tool, in accordance with one or more embodiments of the present disclosure. The overlay metrology tool 102 may include any type of x-ray tool known in the art providing an x-ray illumination beam 118 and capturing an associated collection signal 128, which may include, but is not limited to, x-ray emissions, optical emissions, or particle emissions. Examples of x-ray configurations include, but are not limited to, a small-angle x-ray scatterometer (SAXR), or a soft x-ray reflectometer (SXR).

For example, the overlay metrology tool 102 may include a SAXR tool. SAXS is a scatterometry technology using hard x-rays (e.g., greater than 15 keV). SAXS is generally described in the following publications, all of which are incorporated herein by reference in their entireties: U.S. Pat. Nos. 7,929,667; 10,013,518; 9,885,962; 10,324,050; 10,352, 695; U.S.

Patent Publication No. 20180106735; "Intercomparison between optical and x-ray scatterometry measurements of FinFET structures" by Lemaillet, Germer, Kline et al., Proc. SPIE, v.8681, p. 86810Q (2013)); and "X-ray scattering critical dimensional metrology using a compact x-ray source for next generation semiconductor devices," J. Micro/Nanolith. MEMS MOEMS 16(1), 014001 (January-March 2017).

By way of another example, the overlay metrology tool 102 may include an SXR tool. SXR is a scatterometry technology that uses soft X-ray energy photons (<3 keV). SXR is generally described in U.S. Patent Publication No. 20190017946 and U.S. patent application Ser. No. 17/137, 840, both of which are incorporated herein by reference in its entirety.

In some embodiments, the overlay metrology tool 102 includes x-ray control optics 136 suitable for collimating or focusing an x-ray illumination beam 118 and collection pathway lenses 132 (not shown) suitable for collecting, collimating, and/or focusing x-rays from the sample 104. For example, the overlay metrology tool 102 may include, but is not limited to, x-ray collimating mirrors, specular x-ray optics such as grazing incidence ellipsoidal mirrors, polycapillary optics such as hollow capillary x-ray waveguides, multilayer optics, or systems, or any combination thereof. In some embodiments, the overlay metrology tool 102 includes an x-ray detector 126 such as, but not limited to, an x-ray monochromator (e.g., a crystal monochromator such as a Loxley-Tanner-Bowen monochromator, or the like) x-ray apertures, x-ray beam stops, or diffractive optics such as zone plates.

FIG. 1D is a conceptual view of the overlay metrology tool 102 configured as a particle-beam metrology tool (e.g., an e-beam metrology tool), in accordance with one or more embodiments of the present disclosure.

In some embodiments, the overlay metrology tool 102 includes one or more particle focusing elements (e.g., illumination pathway lenses 122, collection pathway lenses 132 (not shown), or the like). For example, the one or more particle focusing elements may include, but are not limited to, a single particle focusing element or one or more particle focusing elements forming a compound system. Further, the one or more particle focusing elements may include any type of electron lenses known in the art including, but not limited to, electrostatic, magnetic, uni-potential, or double-potential lenses. It is noted herein that the description of a voltage contrast imaging inspection system as depicted in FIG. 1C and the associated descriptions above are provided solely for illustrative purposes and should not be interpreted as limiting. For example, the overlay metrology tool 102 may include any excitation source known in the art suitable for generating inspection data on a sample 104. In some embodiments, the overlay metrology tool 102 includes two or more particle beam sources (e.g., electron beam sources or ion beam sources) for the generation of two or more particle beams. In a further embodiment, the overlay metrology tool 102 includes one or more components (e.g., one or more electrodes) configured to apply one or more voltages to one or more locations of the sample 104. In this regard, the overlay metrology tool 102 may generate voltage contrast imaging data.

In some embodiments, the overlay metrology tool 102 includes one or more particle detectors 126 to image or otherwise detect particles emanating from the sample 104. In some embodiments, a detector 126 includes an electron collector (e.g., a secondary electron collector, a backscattered electron detector, or the like). In some embodiments, a detector 126 includes a photon detector (e.g., a photodetector, an x-ray detector, a scintillating element coupled to a photomultiplier tube (PMT) detector, or the like) for detecting electrons and/or photons from the sample surface.

Referring now generally to FIGS. 1A-1D, various hardware configurations may be separated into discrete operational systems or integrated within a single tool. For example, metrology with a combination of multiple hardware configurations in a single tool generally described in U.S. Pat. No. 7,933,026 which is hereby incorporated by reference in its entirety. By way of another example, metrology with multiple metrology tools is generally described in U.S. Pat. No. 7,478,019, which is incorporated herein by reference in its entirety.

The overlay metrology tool 102 may further include various hardware configurations to measure various structure and/or material characteristics of one or more layers of the sample 104 in addition to overlay such as, but not limited to, critical dimensions (CDs) of one or more structures, film thicknesses, or film compositions after one or more fabrication steps.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:
   a controller including one or more processors configured to execute program instructions causing the one or more processors to:
   receive overlay data for a plurality of in-die overlay targets on a skew training sample from one or more overlay metrology tools, wherein the plurality of in-die overlay targets are distributed across a plurality of fields associated with different exposures of a lithography tool, wherein the in-die overlay targets of the plurality of in-die overlay targets within at least some of the plurality of fields have programmed overlay offsets spanning a selected range around a value of zero, wherein the plurality of fields are fabricated with a range of programmed skew offsets associated with programmed errors of the lithography tool;
   generate asymmetric target signals representative of physical overlay for the plurality of in-die overlay targets using an asymmetric function based on the overlay data for the plurality of in-die overlay targets, wherein the asymmetric function provides a value of zero when the physical overlay is zero and a sign indicative of a direction of the physical overlay;
   generate corrected overlay offsets for the plurality of in-die overlay targets on the skew training sample based on the asymmetric target signals;
   generate self-calibrated overlay offsets for the plurality of in-die overlay targets on the skew training sample based on the programmed overlay offsets and the corrected overlay offsets;
   generate a trained overlay recipe to provide overlay measurements based on overlay data from the one or more overlay metrology tools as inputs using training data including at least the corrected programmed overlay offsets and the overlay data of the plurality of in-die overlay targets on the skew training sample; and
   generate overlay measurements for one or more additional in-die overlay targets on one or more additional samples using the trained overlay recipe based on overlay data for the one or more additional in-die overlay targets from the one or more overlay metrology tools.

2. The overlay metrology system of claim 1, wherein the asymmetric function comprises:
   subtracting overlay data from a particular one of the plurality of in-die overlay targets associated with illumination at opposing azimuth angles; and
   reducing the subtracted overlay data to a single value.

3. The overlay metrology system of claim 2, wherein reducing the subtracted overlay data to a single value comprises:
   at least one of summing values of the subtracted overlay data or performing a square root of a summation of values of the subtracted overlay data.

4. The overlay metrology system of claim 2, wherein reducing the subtracted overlay data to a single value comprises:
   performing a principal component analysis on values of the subtracted overlay data.

5. The overlay metrology system of claim 1, wherein generating asymmetric target signals representative of physical overlay for the plurality of in-die overlay targets using an asymmetric function based on the overlay data for the plurality of in-die overlay targets comprises:
   identifying a set of measurement conditions of at least one of the one or more metrology signals providing the overlay data sensitive to an overlay parameter and insensitive to one or more additional parameters based on selected thresholds; and
   generating the asymmetric target signals representative of physical overlay for the plurality of in-die overlay targets using an asymmetric function based on the overlay data for the plurality of in-die overlay targets based on the set of measurement conditions.

6. The overlay metrology system of claim 5, wherein identifying a set of measurement conditions of at least one of the one or more metrology signals providing overlay data sensitive to the overlay parameter and insensitive to the one or more additional parameters based on the selected thresholds comprises:

identifying a set of measurement conditions of at least one of the one or more metrology signals providing overlay data sensitive to the overlay parameter and insensitive to the one or more additional parameters based on selected thresholds using a machine-learning model.

7. The overlay metrology system of claim 1, wherein generating corrected overlay offsets for the plurality of in-die overlay targets on the skew training sample based on the asymmetric target signals comprises:
generating per-field correction functions based on the asymmetric target signals; and
correcting the programmed overlay offsets of the plurality of in-die overlay targets based on the per-field correction functions.

8. The overlay metrology system of claim 1, wherein generating corrected overlay offsets for the plurality of in-die overlay targets on the skew training sample based on the asymmetric target signals comprises:
determining field-zero programmed overlay offsets corresponding to values of the programmed overlay offsets for each of the plurality of fields at which the asymmetric target signals have values of zero; and
correcting the programmed overlay offsets of the plurality of in-die overlay targets based on the field-zero programmed overlay offsets.

9. The overlay metrology system of claim 1, further comprising:
calibrating the corrected overlay offsets with overlay data of at least some of the plurality of in-die overlay targets with a particle-beam overlay metrology tool.

10. The overlay metrology system of claim 1, wherein generating self-calibrated overlay offsets for the plurality of in-die overlay targets on the skew training sample based on the programmed overlay offsets and the corrected overlay offsets comprises:
fitting the programmed overlay offsets and the self-calibrated overlay offsets for the plurality of in-die overlay targets to a fitting function; and
evaluating the fitting function for the programmed overlay offsets of the plurality of in-die overlay targets to generate the self-calibrated overlay offsets.

11. The overlay metrology system of claim 10, wherein the fitting function comprises:
a linear fitting function.

12. The overlay metrology system of claim 11, wherein generating self-calibrated overlay offsets for the plurality of in-die overlay targets on the skew training sample based on the programmed overlay offsets and the corrected overlay offsets further comprises:
iteratively determining a slope of the linear fitting function.

13. The overlay metrology system of claim 1, wherein at least one of the one or more overlay metrology tools comprises:
at least one of an optical metrology tool, an x-ray metrology tool, or a particle-beam metrology tool.

14. The overlay metrology system of claim 1, wherein at least a portion of the overlay data for the plurality of in-die overlay targets comprises:
at least one of spectral data or imaging data.

15. The overlay metrology system of claim 1, wherein at least one of the one or more overlay metrology tools comprises:
at least one of a reflectometer or an ellipsometer.

16. The overlay metrology system of claim 15, wherein at least one of the one or more overlay metrology tools comprises:

a Mueller ellipsometer.

17. The overlay metrology system of claim 1, wherein the training data further comprises:
at least one of synthetically-generated overlay data from a parameterized overlay model associated with the overlay recipe or overlay data from the one or more additional samples.

18. The overlay metrology system of claim 1, wherein the overlay recipe comprises:
a machine learning recipe.

19. The overlay metrology system of claim 1, wherein the one or more processors are further configured to execute program instructions causing the one or more processors to:
generate correctables for a lithography tool based on the overlay data of the one or more additional in-die overlay targets; and
direct the lithography tool to adjust one or more parameters based on the correctables.

20. The overlay metrology system of claim 1, wherein the one or more processors are further configured to execute program instructions causing the one or more processors to:
store at least one of the overlay data for the plurality of in-die overlay targets, the programmed overlay offsets, the asymmetric target signals, the corrected overlay offsets, the self-calibrated overlay offsets, or the overlay data for the one or more additional in-die overlay targets on a data server.

21. The overlay metrology system of claim 20, wherein the overlay data for at least one of the plurality of in-die overlay targets or the one or more additional in-die overlay targets comprises:
overlay data associated with two or more process steps, wherein the two or more process steps include at least one of after-development inspection (ADI) steps, after-etch inspection (AEI) steps, or after-cleaning inspection (ACI) steps.

22. An overlay metrology system comprising:
one or more overlay metrology tools; and
a controller including one or more processors configured to execute program instructions causing the one or more processors to:
receive overlay data for a plurality of in-die overlay targets on a skew training sample from the one or more overlay metrology tools, wherein the plurality of in-die overlay targets are distributed across a plurality of fields associated with different exposures of a lithography tool, wherein the in-die overlay targets of the plurality of in-die overlay targets within at least some of the plurality of fields have programmed overlay offsets spanning a selected range around a value of zero, wherein the plurality of fields are fabricated with a range of programmed skew offsets associated with programmed errors of the lithography tool;
generate asymmetric target signals representative of physical overlay for the plurality of in-die overlay targets using an asymmetric function based on the overlay data for the plurality of in-die overlay targets, wherein the asymmetric function provides a value of zero when the physical overlay is zero and a sign indicative of a direction of the physical overlay;
generate corrected overlay offsets for the plurality of in-die overlay targets on the skew training sample based on the asymmetric target signals;

generate self-calibrated overlay offsets for the plurality of in-die overlay targets on the skew training sample based on the programmed overlay offsets and the corrected overlay offsets;

generate a trained overlay recipe to provide overlay measurements based on overlay data from the one or more overlay metrology tools as inputs using training data including at least the corrected programmed overlay offsets and the overlay data of the plurality of in-die overlay targets on the skew training sample; and generate overlay measurements for one or more additional in-die overlay targets on one or more additional samples using the trained overlay recipe based on overlay data for the one or more additional in-die overlay targets from the one or more overlay metrology tools.

23. The overlay metrology system of claim 22, wherein the one or more overlay metrology tools comprises:

at least one of an optical metrology tool, an x-ray metrology tool, or a particle-beam metrology tool.

24. The overlay metrology system of claim 22, further comprising:

a data storage device configured to store at least one of the overlay data for the plurality of in-die overlay targets, the programmed overlay offsets, the asymmetric target signals, the corrected overlay offsets, the self-calibrated overlay offsets, or the overlay data for the one or more additional in-die overlay targets.

25. The overlay metrology system of claim 22, wherein generating a trained overlay recipe to provide overlay measurements based on overlay data from the one or more overlay metrology tools as inputs using training data including at least the corrected programmed overlay offsets and the overlay data of the plurality of in-die overlay targets on the skew training sample comprises:

generate a trained overlay recipe to provide overlay measurements based on overlay data from the one or more overlay metrology tools as inputs using training data from a data server.

26. An overlay metrology method comprising:

preparing a skew training sample including a plurality of in-die overlay targets distributed across a plurality of fields associated with different exposures of a lithography tool, wherein the in-die overlay targets of the plurality of in-die overlay targets within at least some of the plurality of fields have programmed overlay offsets spanning a selected range around a value of zero, wherein the plurality of fields are fabricated with a range of programmed skew offsets associated with programmed errors of the lithography tool;

collecting overlay data for the plurality of in-die overlay targets on the skew training sample using one or more overlay metrology tools;

generating asymmetric target signals representative of physical overlay for the plurality of in-die overlay targets using an asymmetric function based on the overlay data for the plurality of in-die overlay targets, wherein the asymmetric function provides a value of zero when physical overlay is zero and a sign indicative of a direction of the physical overlay;

generating corrected overlay offsets for the plurality of in-die overlay targets on the skew training sample based on the asymmetric target signals;

generating self-calibrated overlay offsets for the plurality of in-die overlay targets on the skew training sample based on the programmed overlay offsets and the corrected overlay offsets;

generating a trained overlay recipe to provide overlay measurements based on overlay data from the one or more overlay metrology tools as inputs using training data including at least the corrected programmed overlay offsets and the overlay data of the plurality of in-die overlay targets on the skew training sample; and generating overlay measurements for one or more in-die overlay targets on one or more additional samples using the trained overlay recipe based on overlay data for the one or more additional in-die overlay targets from the one or more overlay metrology tools.

* * * * *